US010656179B2

(12) United States Patent
Ota

(10) Patent No.: US 10,656,179 B2
(45) Date of Patent: May 19, 2020

(54) CONTACT TERMINAL, INSPECTION JIG, AND INSPECTION DEVICE

(71) Applicant: NIDEC READ CORPORATION, Kyoto (JP)

(72) Inventor: Norihiro Ota, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 0 days.

(21) Appl. No.: 16/464,718

(22) PCT Filed: Nov. 28, 2017

(86) PCT No.: PCT/JP2017/042508
§ 371 (c)(1),
(2) Date: May 29, 2019

(87) PCT Pub. No.: WO2018/101232
PCT Pub. Date: Jun. 7, 2018

(65) Prior Publication Data
US 2019/0346485 A1    Nov. 14, 2019

(30) Foreign Application Priority Data
Nov. 30, 2016    (JP) ................................ 2016-232912

(51) Int. Cl.
*G01R 1/073*    (2006.01)
*G01R 1/067*    (2006.01)
(Continued)

(52) U.S. Cl.
CPC ..... *G01R 1/07328* (2013.01); *G01R 1/06722* (2013.01); *G01R 31/2601* (2013.01); *G01R 31/2886* (2013.01)

(58) Field of Classification Search
CPC ............ G01R 1/06716; G01R 1/06722; G01R 1/06727; G01R 1/07328; G01R 31/2601; G01R 31/2886
(Continued)

(56) References Cited

U.S. PATENT DOCUMENTS 5,291,129 A * 3/1994 Kazama ............. G01R 1/06738
324/750.26
5,614,820 A * 3/1997 Aoyama ................ G01R 31/04
324/538
(Continued)

FOREIGN PATENT DOCUMENTS

JP    2010276510 A    12/2010
JP    2013053931 A    3/2013
(Continued)

*Primary Examiner* — Patrick Assouad
*Assistant Examiner* — Demetrius R Pretlow
(74) *Attorney, Agent, or Firm* — Viering, Jentschura & Partner MBB

(57) ABSTRACT

A contact terminal defined by a probe may include a tubular body made of an electrically conductive material and central conductors, each of which is made of an electrically conductive material and has a stick shape. The central conductors and may include stick-shaped bodies inserted into the tubular body. The tubular body may include spring portions, which are defined by helical bodies formed by helical grooves along a circumference thereof and clasping portions, which are fitted onto proximal end portions of the stick-shaped bodies to fit the proximal end portions. The clasping portions may be defined by a circumferential wall of the tubular body and a slit extending from end portions of the helical grooves, which define the spring portions, in an axial direction of the tubular body, at which, portions are separated in a circumferential direction of the tubular body.

20 Claims, 12 Drawing Sheets

(51) Int. Cl.
*G01R 31/26* (2020.01)
*G01R 31/28* (2006.01)

(58) Field of Classification Search
USPC .................. 324/754.03, 754.08–754.09, 324/754.12–754.14, 755.01–755.03
See application file for complete search history.

(56) References Cited

U.S. PATENT DOCUMENTS

| | | | | |
|---|---|---|---|---|
| 5,982,187 | A * | 11/1999 | Tarzwell | G01R 1/06722 324/72.5 |
| 6,034,532 | A * | 3/2000 | Tarzwell | G01R 1/06722 324/755.05 |
| 6,424,163 | B1 * | 7/2002 | Ott | G01R 1/07328 324/754.14 |
| 6,803,778 | B2 * | 10/2004 | Taniguchi | G01R 1/073 200/61.76 |
| 7,025,602 | B1 * | 4/2006 | Hwang | H01R 13/2421 439/66 |
| 7,256,593 | B2 * | 8/2007 | Treibergs | G01R 1/06722 324/754.05 |
| 8,159,251 | B2 * | 4/2012 | Sasaki | G01R 1/07314 324/754.07 |
| 8,324,919 | B2 * | 12/2012 | Chabineau-Lovgren | G01R 1/06722 324/754.03 |
| 8,373,430 | B1 * | 2/2013 | Sochor | H01R 13/2421 29/874 |
| 8,408,946 | B1 * | 4/2013 | Sochor | H01R 4/4863 324/755.01 |
| 8,460,010 | B2 * | 6/2013 | Kimura | G01R 1/06722 439/66 |
| 8,547,128 | B1 * | 10/2013 | Sochor | G01R 1/06722 324/750.25 |
| 8,669,774 | B2 * | 3/2014 | Kato | G01R 1/06722 324/755.01 |
| 8,710,856 | B2 * | 4/2014 | Swart | G01R 1/06722 324/538 |
| 8,975,906 | B2 * | 3/2015 | Jeong | G01R 1/06722 324/754.03 |
| 9,069,012 | B2 | 6/2015 | Yano et al. | |
| 9,109,294 | B2 * | 8/2015 | Kojima | C25D 1/02 |
| 9,726,693 | B2 * | 8/2017 | Lee | G01R 1/06722 |
| 9,797,925 | B2 * | 10/2017 | Teranishi | G01R 1/067 |
| 9,829,506 | B2 * | 11/2017 | Treibergs | G01R 1/06722 |
| 10,018,669 | B2 * | 7/2018 | Shibutani | G01R 1/06722 |
| 10,041,974 | B2 * | 8/2018 | Li | G01R 1/06722 |
| 2004/0137767 | A1 * | 7/2004 | Suzuki | H01R 13/2421 439/73 |
| 2005/0030050 | A1 * | 2/2005 | Jung | G01R 1/06722 324/754.14 |
| 2005/0237070 | A1 * | 10/2005 | Kazama | G01R 1/06722 324/754.03 |
| 2006/0006888 | A1 * | 1/2006 | Kruglick | G01R 1/0483 324/754.14 |
| 2010/0007365 | A1 * | 1/2010 | Ishizuka | G01R 1/06722 324/754.14 |
| 2010/0123476 | A1 * | 5/2010 | Kazama | G01R 1/06722 324/755.01 |
| 2010/0182027 | A1 * | 7/2010 | Petrick | G01R 1/06788 324/755.01 |
| 2013/0057308 | A1 * | 3/2013 | Yano | G01R 3/00 324/755.01 |
| 2016/0118738 | A1 | 4/2016 | Nasu et al. | |
| 2018/0080955 | A1 * | 3/2018 | Hsieh | G01R 1/06722 |
| 2018/0236758 | A1 | 8/2018 | Burgold et al. | |
| 2019/0011479 | A1 * | 1/2019 | Ota | H01R 13/2421 |

FOREIGN PATENT DOCUMENTS

| | | |
|---|---|---|
| JP | 2013190270 A | 9/2013 |
| TW | 201538984 A | 10/2015 |
| TW | 201616732 A | 5/2016 |

* cited by examiner

CONTACT TERMINAL, INSPECTION JIG, AND INSPECTION DEVICE

CROSS-REFERENCE TO RELATED APPLICATIONS

This application is a national stage entry according to 35 U.S.C. 371 of PCT Application No. PCT/JP2017/042508 filed on Nov. 28, 2017, which claims priority to Japanese Application No. 2016-232912 filed on Nov. 30, 2016, which are entirely incorporated herein by reference.

TECHNICAL FIELD

The present disclosure relates to a contact terminal used to inspect an inspection target, an inspection jig to bring the contact terminal into contact with the inspection target, and an inspection device including the inspection jig.

BACKGROUND

A contact terminal for use in an inspection device may include a tubular body (i.e., a cylindrical member) including a spring portion defined in a middle portion, and a columnar central conductor (i.e., a stick-shaped member) inserted through the tubular body, and an inspection jig may use this contact terminal (see, for example, JP 2013-53931 A). In this contact terminal, the central conductor may be fixed to the tubular body in the vicinity of a tip end of the tubular body through, for example, welding or crimping, with an end portion of the central conductor protruding from the tubular body. Once a first end portion of the tubular body is brought into contact with an electrode portion, and a second end portion of the central conductor is brought into contact with an inspection target, the first end portion of the tubular body and the second end portion of the central conductor may be urged toward the electrode portion and the inspection target, respectively, in accordance with elastic resilience of the spring portion, whereby the contact of the contact terminal with the electrode portion and the inspection target may be stabilized.

SUMMARY

Incidentally, multiple contact terminals each having extremely small diameter may be provided at the inspection jig, and the central conductors (i.e., conductive portions each having a small diameter) which form the contact terminals may be fixed to the tubular body (i.e., a cylindrical portion having a large diameter) including the spring portion through welding or crimping. However, since this fixing operation may be extremely complicated, it is difficult to appropriately manufacture the contact terminals. There may be a problem that it is difficult to configure a contact pressure of the contact terminal applied to an electrode and an inspection target to be an appropriate value.

An object of the present disclosure may be to provide a contact terminal, an inspection jig, and an inspection device, which are easy to be appropriately manufactured and are easy to configure a contact pressure of a contact terminal applied to an electrode and an inspection target to be an appropriate value.

A contact terminal according to a non-limiting aspect of the present disclosure may include a tubular body, which is made of an electrically conductive material and is tubular, and a central conductor, which is made of an electrically conductive material and is in a shape of a stick. The central conductor may include a stick-shaped body inserted into the tubular body. The tubular body may include a spring portion defined by a helical body configured such that a helical groove is formed along a circumference of the tubular body, and a clasping portion that is fitted on a proximal end portion of the stick-shaped body to clasp the proximal end portion. The clasping portion is defined by a circumferential wall at which portions are separated by a slit formed in an end portion of the tubular body in a circumferential direction of the tubular body.

A contact terminal according to another non-limiting aspect of the present disclosure may include a tubular body, which is made of an electrically conductive material and is tubular, and a central conductor, which is made of an electrically conductive material and is a shape of a stick. The central conductor may include a first central conductor that includes a first stick-shaped body inserted into a first end portion of the tubular body, and a second central conductor that includes a second stick-shaped body inserted into a second end portion of the tubular body. The tubular body may include a first clasping portion that clasps a proximal end portion of the first stick-shaped body at the first end portion, a second clasping portion that clasps a proximal end portion of the second stick-shaped body at the second end portion of the tubular body, a first spring portion configured to be contiguous with the first clasping portion, a second spring portion configured to be contiguous with the second clasping portion, and a tubular joining portion that joins the first and second spring portions to each other. In the first and second central conductors, tip end portions of the first and second stick-shaped bodies are inserted into the joining portion of the tubular body, and the first and second stick-shaped bodies are configured to have a total length such that a state in which distal end surfaces of both the stick-shaped bodies face each other a gap is maintained.

An inspection jig according to still another non-limiting aspect of the present disclosure may include the contact terminal, and a support member that supports the contact terminal.

An inspection device according to still another non-limiting aspect of the present disclosure may include the inspection jig, and an inspection processing unit that inspects an inspection target based on an electric signal obtained by bringing the contact terminal into contact with an inspection point formed at the inspection target.

DETAILED DESCRIPTION

Figure 1:
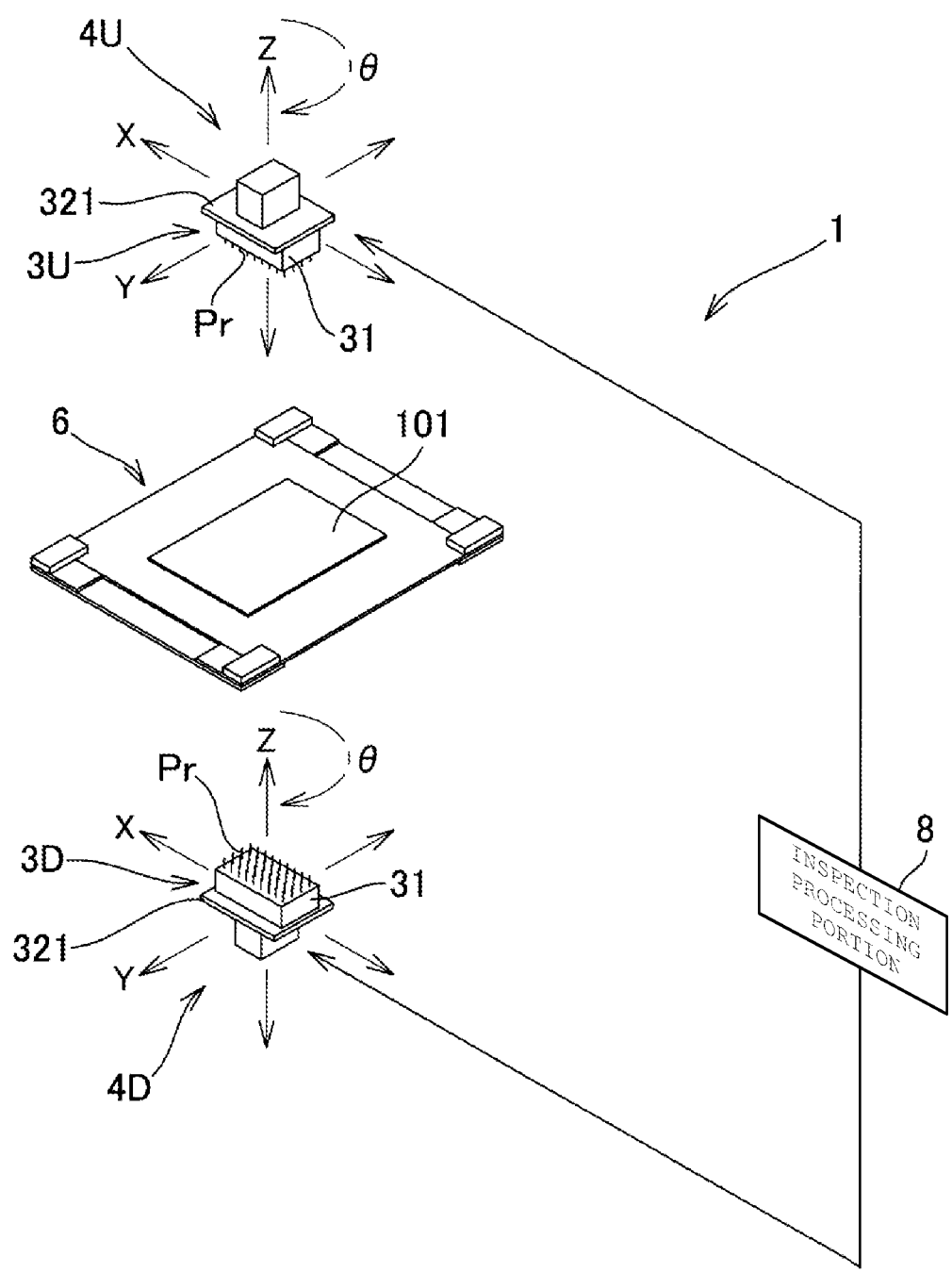
FIG. 1 is a perspective view schematically illustrating the structure of a board inspection device including inspection jigs and contact terminals according to a first non-limiting embodiment of the present disclosure.

Hereinafter, non-limiting embodiments of the present disclosure will be described with reference to the accompanying drawings. In the accompanying drawings, like parts are designated by like reference characters, and redundant description will be omitted.

First Non-Limiting Embodiment

FIG. 1 is a schematic diagram schematically illustrating the structure of a board inspection device 1 including inspection jigs and contact terminals according to a first non-limiting embodiment of the present disclosure. The board inspection device 1 corresponds to an example of an inspection device. The board inspection device 1 illustrated in FIG. 1 is an device used to inspect a circuit pattern formed on a board 101, which is an example of an inspection target.

Various types of boards can be used as the board 101, including, for example, a printed circuit board, a flexible board, a ceramic multilayer circuit board, an electrode plate for use in a liquid crystal display or a plasma display, a semiconductor substrate, a package board for use in a semiconductor package, and a film carrier. The inspection target may not necessarily be a board, but may alternatively be, for example, an electronic component in a semiconductor device (e.g., an integrated circuit (IC)) or the like, or any other object on which an electrical inspection is to be performed.

The board inspection device 1 illustrated in FIG. 1 includes inspection portions 4U and 4D, a board fixing device 6, and an inspection processing portion 8. The board fixing device 6 is configured to fix the board 101 to be inspected at a predetermined position. The inspection portions 4U and 4D include inspection jigs 3U and 3D, respectively, and include a driving mechanism (not illustrated). The inspection jigs 3U and 3D are supported by the driving mechanism (not illustrated) so as to be capable of moving in x-axis, y-axis, and z-axis directions perpendicular to each other, and are supported so as to be capable of rotating about a z-axis.

The inspection portion 4U is arranged above the board 101, which is fixed by the board fixing device 6. The inspection portion 4D is arranged below the board 101, which is fixed by the board fixing device 6. The inspection jigs 3U and 3D, each of which is configured to inspect a circuit pattern formed on the board 101, are detachably disposed in the inspection portions 4U and 4D, respectively. The inspection portions 4U and 4D include connectors (not shown) which are detachably connected to the inspection jigs 3U and 3D, respectively. Hereinafter, the inspection portions 4U and 4D will be collectively referred to as an inspection portion 4 as appropriate.

Each of the inspection jigs 3U and 3D include a plurality of probes Pr (i.e., contact terminals), a support member 31 configured to support the plurality of probes Pr, and a base plate 321. Each probe Pr corresponds to an example of a contact terminal. The base plate 321 is provided with electrodes, which will be described below and each of which is to be brought into contact with, and electrical connection with, a first end portion of a separate one of the probes Pr. Each of the inspection portions 4U and 4D includes a connection circuit (not shown) configured to bring a rear end of each probe Pr into electrical connection with the inspection processing portion 8 through the corresponding electrode provided in the base plate 321, or make a switch in the connection.

Each probe Pr is configured to have a substantially stick-like overall shape, and a specific structure of the probe Pr will be described in detail below. The support member 31 includes a plurality of through holes each of which is configured to support a separate one of the probes Pr. Each through hole is formed so as to correspond to a position of an inspection point configured on a wiring pattern of the board 101 as the inspection target. Accordingly, the support member 31 is configured such that the first end portion of each probe Pr is brought into contact with the inspection point of the board 101. For example, the probes Pr are disposed at positions corresponding to points of intersection on a grid. The grid is oriented such that horizontal and vertical lines of the grid extend in the x-axis and y-axis directions perpendicular to each other. Each inspection point is, for example, a wiring pattern, a solder bump, a connection terminal, or the like.

The inspection jigs 3U and 3D are similar in structure except in the arrangement of the probes Pr and in that the inspection jigs 3U and 3D are attached in opposite directions, i.e., upwardly and downwardly, to the inspection portions 4U and 4D, respectively. Hereinafter, the inspection jigs 3U and 3D will be collectively referred to as an inspection jig 3 as appropriate. The inspection jig 3 can be replaced with another inspection jig in accordance with the type of the board 101 to be inspected.

The inspection processing portion 8 includes, for example, a power supply circuit, a voltmeter, an ammeter, a microcomputer, and so on. The inspection processing portion 8 is configured to control the driving mechanism (not shown) to move and position each of the inspection portions 4U and 4D to bring each probe Pr into contact with the corresponding inspection point in the board 101. Each inspection point is thus electrically connected to the inspection processing portion 8. In the above-described situation, the inspection processing portion 8 is configured to supply a test electric current or voltage to each inspection point in the board 101 through the probes Pr of the inspection jigs 3, and inspect the board 101 for, for example, a disconnection in a circuit pattern, a short circuit, or the like on the basis of a voltage signal or a current signal obtained from each probe Pr. Alternatively, the inspection processing portion 8 may be configured to supply an alternating current or voltage to each inspection point, and thus measure an impedance of the inspection target on the basis of a voltage signal or a current signal obtained from each probe Pr.

Figure 2:
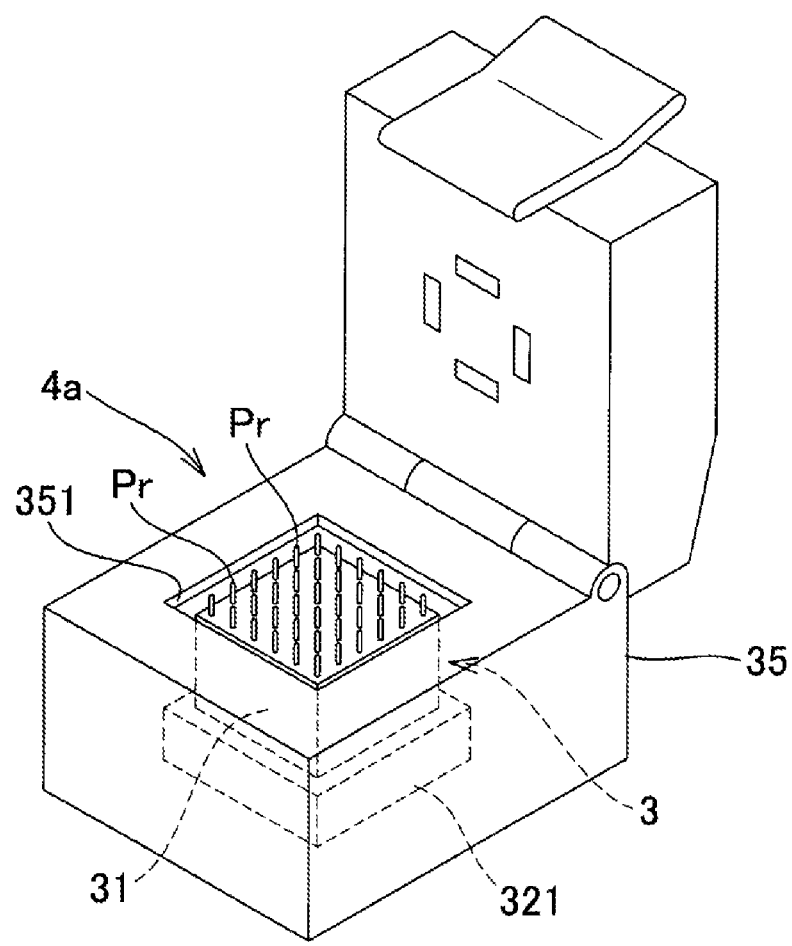
FIG. 2 is a perspective view illustrating another non-limiting example of an inspection portion, which may be provided in the inspection device as illustrated in FIG. 1.

FIG. 2 is a perspective view illustrating another example of an inspection portion 4 which may be provided in the board inspection device 1 illustrated in FIG. 1. An inspection portion 4a illustrated in FIG. 2 includes a so-called IC socket 35 and an inspection jig 3 installed in the IC socket 35. Unlike the inspection portion 4, the inspection portion 4a is not provided with a driving mechanism, and is configured to bring probes Pr into contact with pins, bumps, electrodes, or the like of an IC mounted on the IC socket 35. The inspection device can be configured as an IC inspection device by replacing the inspection portions 4U and 4D illustrated in FIG. 1 with the inspection portion 4a, and setting, for example, a semiconductor device (e.g. an IC) as the inspection target.

Figure 3:
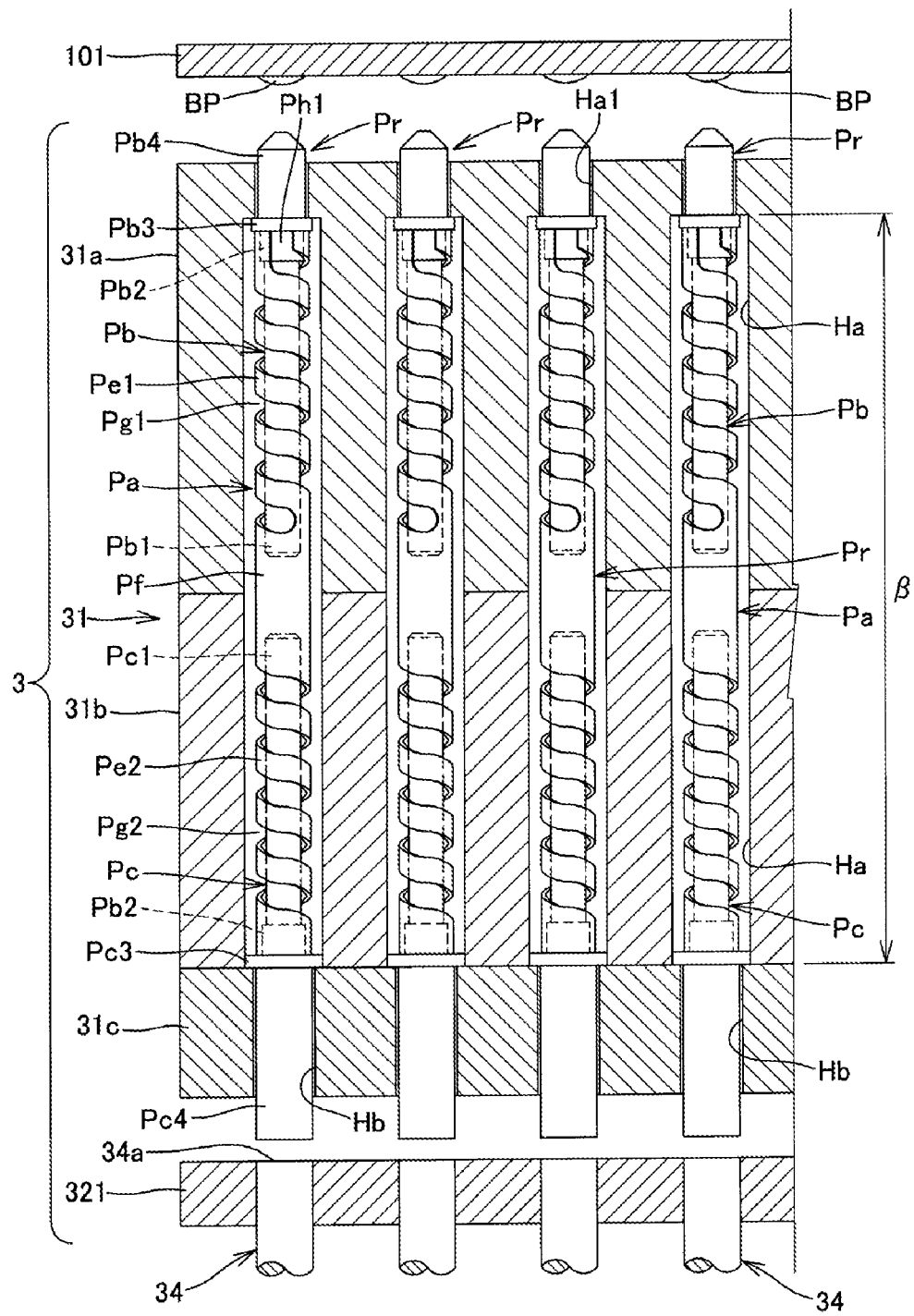
FIG. 3 is a schematic sectional view illustrating a non-limiting example structure of the inspection jig illustrated in FIGS. 1 and 2.

FIG. 3 is a schematic diagram illustrating an example structure of the inspection jig 3 including the support member 31 and the base plate 321 illustrated in FIG. 1. The support member 31 illustrated in FIG. 3 is defined by, for example, plate-shaped support plates 31a, 31b, and 31c placed one upon another. The support plate 31a, which is arranged on the upper side in FIG. 3, is disposed on a front end side of the support member 31, while the support plate 31c, which is arranged on the lower side in FIG. 3, is disposed at a rear end side of the support member 31. In addition, the support member 31 includes a plurality of through holes each of which is configured to pass through the support plates 31a, 31b, and 31c.

Each of the support plates 31a and 31b includes insert hole portions Ha each of which is defined by an opening hole having a predetermined diameter. The support plate 31c includes through holes each of which is defined by a narrow portion Hb having a diameter smaller than that of each insert hole portion Ha. In addition, the support plate 31a, which is arranged on the upper side, includes decreased diameter portions Ha1 each of which has a hole diameter smaller than that of each insert hole portion Ha, in a portion of the support plate 31a which lies at a surface opposite to the board 101 which is the inspection target, that is, in a front end portion of the support member 31. Then, the decreased diameter portion Ha1 and the insert hole portion Ha in the support plate 31a, the insert hole portion Ha in the support plate 31b, and the narrow portion Hb in the support plate 31c are connected with each other to define each through hole.

Note that the support member 31 may not necessarily be defined by the plate-shaped support plates 31a, 31b, and 31c placed one upon another, but may alternatively be defined by, for example, a single monolithic member including the through hole which is defined by the decreased diameter portion Ha1, the insert hole portion Ha, and the narrow portion Hb. The entire through hole may alternatively be defined by an insert hole portion Ha having the predetermined diameter, with the narrow portion Hb and the decreased diameter portion Ha1, each of which has a smaller diameter, being omitted. Also note that the support plates 31a and 31b of the support member 31 may not necessarily be placed one upon the other, but may alternatively be spaced from each other with, for example, a support or the like being configured to join the support plates 31a and 31b to each other.

The base plate 321 made of, for example, an insulating resin material is attached to the rear end side of the support plate 31c. A rear-end opening portion of the through hole, that is, a rear end surface of the narrow portion Hb is blocked by the base plate 321. Wires 34 are attached to the base plate 321 such that each wire 34 passes through the base plate 321 at a position opposite to the rear-end opening portion of a separate one of the through holes. A surface of the base plate 321 on a front-end surface, which faces the support plate 31c, and an end surface of each wire 34 are configured to be flush with each other. The end surface of each wire 34 forms an electrode 34a.

Each of the probes Pr, which are inserted into the respective through holes of the support member 31 and are thus attached to the support member 31, includes a tubular body Pa, and first and second central conductors Pb and Pc. The tubular body Pa is tubular, and is made of an electrically conductive material. Each of the first and second central conductors Pb and Pc is made of an electrically conductive material, and is in the shape of a stick.

Figure 4:
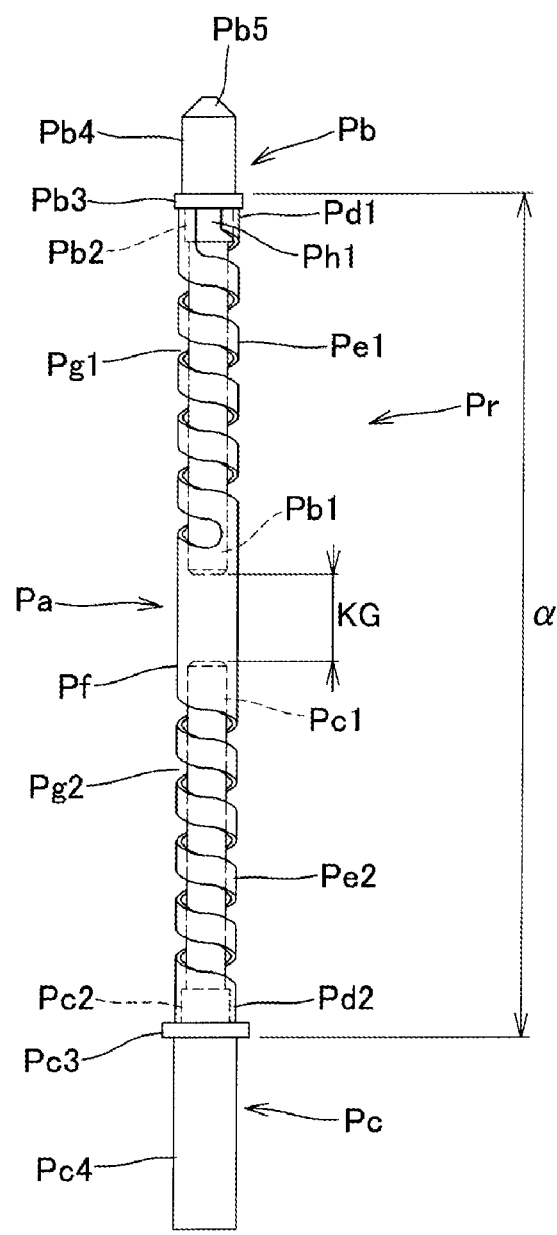
FIG. 4 is a plan view illustrating a specific non-limiting structure of a probe.
Figure 5:
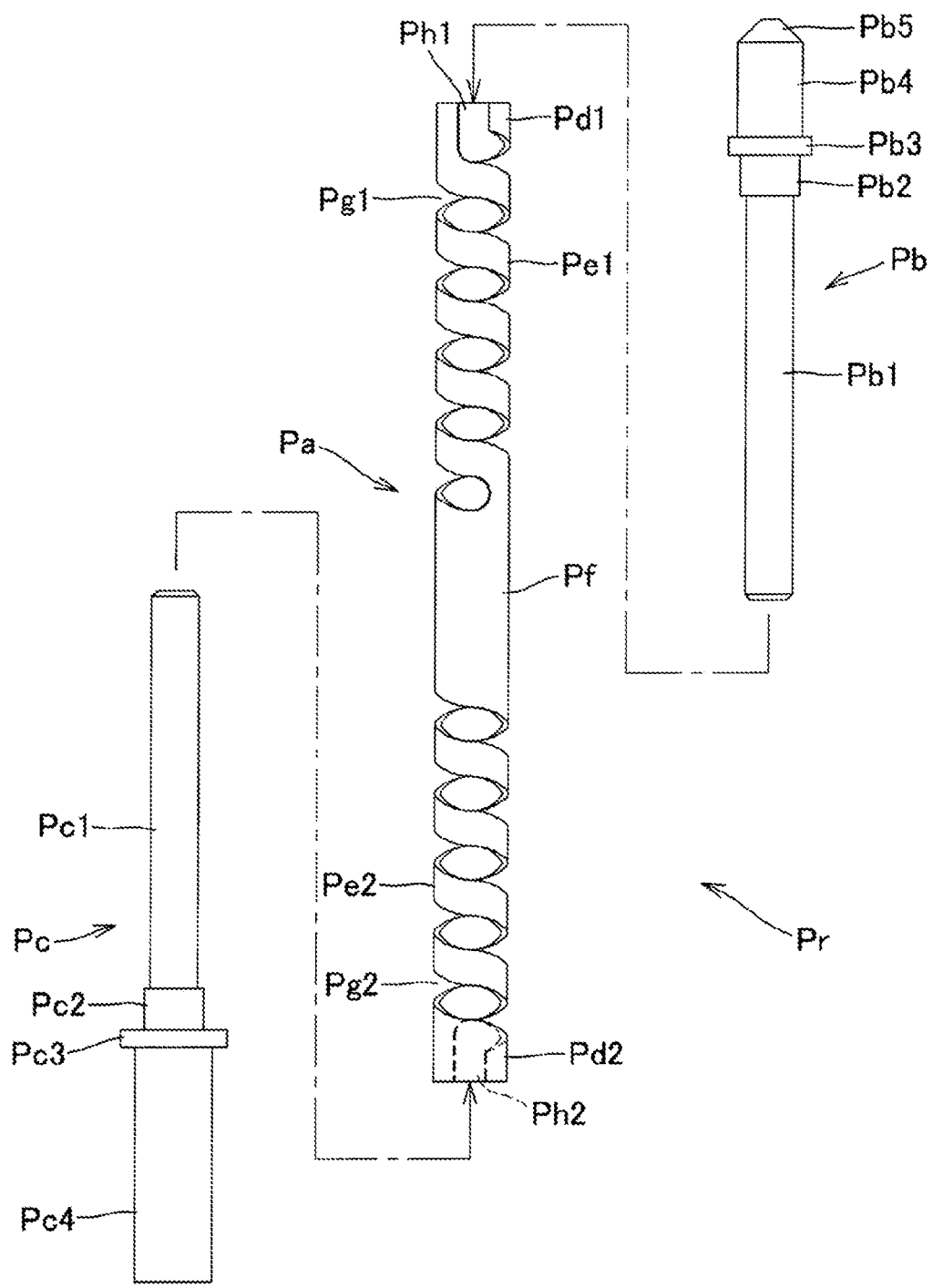
FIG. 5 is a plan view illustrating the non-limiting structure of the probe, illustrating a non-limiting tubular body and a non-limiting contact terminal separately.

FIG. 4 is a plan view illustrating a specific structure of the probe, and FIG. 5 is an explanatory exploded view of the probe Pr, illustrating the tubular body Pa, the first central conductor Pb, and the second central conductor Pc separately. A nickel or nickel alloy tube having an outside diameter of about 25 to 300 μm and an inside diameter of about 10 to 250 μm, for example, can be used to define the tubular body Pa. The tubular body Pa may be configured to have, for example, an outside diameter of about 120 μm, an inside diameter of about 100 μm, and a total length of about 1700 μm. In addition, an inner circumference of the tubular body Pa may be coated with a plating layer, such as, for example, a gold plating layer, and a circumference of the tubular body Pa may be coated with an insulating coating as necessary.

First and second clasping portions Pd1 and Pd2 configured to clasp proximal end portions of first and second stick-shaped bodies Pb1 and Pc1, which define the first and second central conductors Pb and Pc, respectively, as described below are formed at both end portions of the tubular body Pa. The tubular body Pa further includes, between the first and second clasping portions Pd1 and Pd2, first and second spring portions Pe1 and Pe2, each of which has a predetermined length and is capable of expanding and contracting in an axial direction of the tubular body Pa. The tubular body Pa further includes, in a longitudinal middle of the tubular body Pa, a joining portion Pf configured to join the first and second spring portions Pe1 and Pe2 to each other.

For example, a laser beam is emitted from a laser beam machine (not shown) onto a circumferential wall of the tubular body Pa to define first and second helical grooves Pg1 and Pg2 in the circumferential wall of the tubular body Pa, so that the first and second spring portions Pe1 and Pe2, each of which is defined by a helical body extending along the circumference of the tubular body Pa, are defined. Then, the tubular body Pa is configured to be capable of expanding and contracting in the axial direction thereof through deformation of the first and second spring portions Pe1 and Pe2.

Note that the first and second spring portions Pe1 and Pe2, each of which is defined by a helical body, may alternatively be defined by, for example, performing etching on the circumferential wall of the tubular body Pa to define the first and second helical grooves Pg1 and Pg2 therein. The first and second spring portions Pe1 and Pe2 can also be formed by forming the first and second helical grooves Pg1 and Pg2 on the circumferential wall of the tubular body Pa through electroforming.

The joining portion Pf is defined by the circumferential wall portion of the tubular body Pa remaining by forming a portion at which the first and second helical grooves Pg1 and Pg2 are formed on the tubular body Pa. The joining portion Pf is formed at a central portion of the tubular body Pa so as to have a predetermined length.

The first clasping portion Pd1 is defined by the circumferential wall of the tubular body Pa at which portions of the tubular body are separated by a first slit Ph1 extending from an end portion of the first helical groove Pg1 to a first end portion of the tubular body Pa substantially in parallel with the axial direction of the tubular body Pa.

The second clasping portion Pd2 is defined by the circumferential wall of the tubular body Pa at which portions of the tubular body Pa are separated by a second slit Ph2 extending from an end portion of the second helical groove Pg2 to a second end portion of the tubular body Pa substantially in parallel with the axial direction of the tubular body Pa.

The first and second clasping portions Pd1 and Pd2 are configured to be symmetric with respect to a longitudinal midpoint of the tubular body Pa. Accordingly, a specific structure of only the second clasping portion Pd2 will be described below, while a description of a specific structure of the first clasping portion Pd1 will be omitted.

Figure 6A:
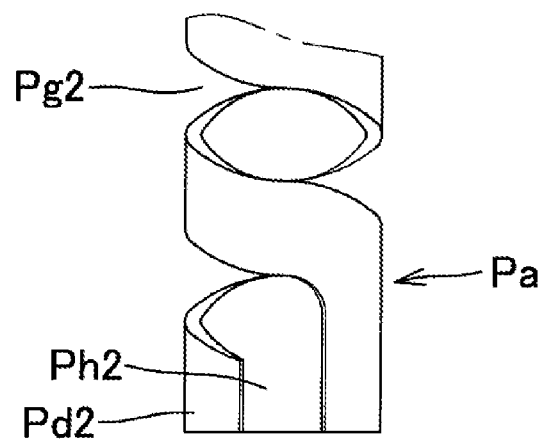
FIG. 6A is an enlarged plan view of a non-limiting end portion of the tubular body, and illustrates a specific non-limiting structure of a clasping portion formed at the end portion of the tubular body illustrated in FIG. 5.
Figure 6B:
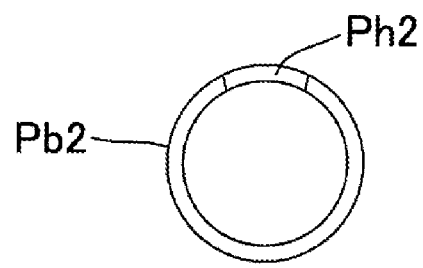
FIG. 6B is an end view when the tubular body is viewed from the bottom of FIG. 6A, and illustrates the specific non-limiting structure of the clasping portion formed at the end portion of the tubular body illustrated in FIG. 5.
Figure 6C:
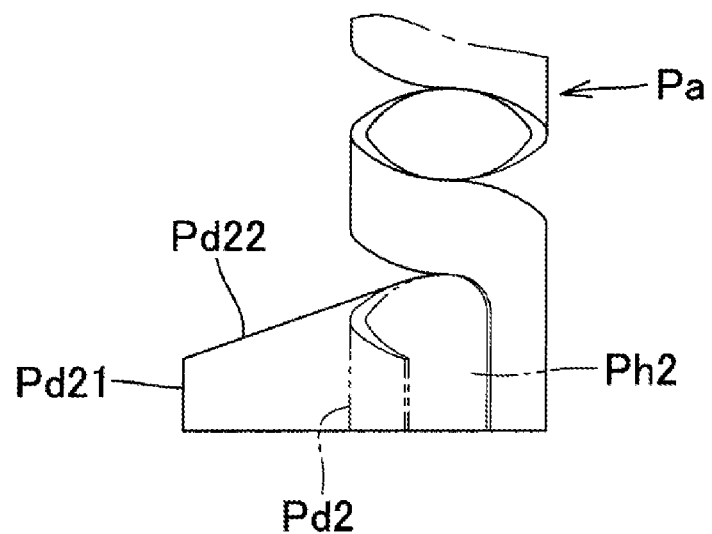
FIG. 6C is a plan view illustrating the clasping portion in a developed state, and illustrates the specific structure of the clasping portion formed at the end portion of the tubular body illustrated in FIG. 5.

FIGS. 6A to 6C illustrate the specific structure of the second clasping portion Pd2 formed at the end portion of the tubular body Pa. FIG. 6A is an enlarged plan view of the end portion of the tubular body Pa, and FIG. 6B is an end view when the second clasping portion Pd2 is viewed from the bottom of FIG. 6A. FIG. 6C is a plan view illustrating the second clasping portion Pd2 in a developed state.

Referring to FIG. 6C, the second clasping portion Pd2 in the developed state has a trapezoidal shape, including a distal end surface Pd21 corresponding to one side of the second slit Ph2, and an inclined surface Pd22 corresponding to one side of a portion of the second helical groove Pg2. Referring to FIG. 6B, the second clasping portion Pd2 having the trapezoidal shape is bent into an arc shape to form the second clasping portion Pd2 in the shape of a C-shaped retaining ring, including a cut portion having a predetermined width, with a portion of the circumferential wall of the tubular body Pa.

Referring to FIGS. 4 and 5, the first central conductor Pb includes the first stick-shaped body Pb1 configured to be inserted into the tubular body Pa so as to have an outside diameter slightly smaller than the inside diameter of the tubular body Pa, a pressed-in portion Pb2 formed at a proximal end portion thereof, a collar portion Pb3 configured to be contiguous with the pressed-in portion Pb2, and a connection portion Pb4 configured to be contiguous with the collar portion Pb3.

The first stick-shaped body Pb1 is configured to have a total length greater than a range in which the first spring portion Pe1 of the tubular body Pa is formed. This allows a tip end portion of the first stick-shaped body Pb1 to be inserted into the joining portion Pf of the tubular body Pa when the first stick-shaped body Pb1 is inserted into the tubular body Pa to fit the first central conductor Pb therein.

A difference between the inside diameter of the tubular body Pa and the outside diameter of the first stick-shaped body Pb1 is configured to be small. Thus, the joining portion Pf of the tubular body Pa and the first stick-shaped body Pb1 establish electrical connection therebetween by being brought into contact with each other while so as to also be slidable at the time of an inspection (to be described below) when the first central conductor Pb has been fitted into the tubular body Pa.

The pressed-in portion Pb2 of the first stick-shaped body Pb1 is configured to have an outside diameter greater than an inside diameter of the first clasping portion Pd1 of the tubular body Pa when the first clasping portion Pb1 is not inserted into the tubular body Pa. As a result, when the first stick-shaped body Pb1 is fitted into the tubular body Pa to fit the first central conductor Pb therein, the pressed-in portion Pb2 is pressed into the first clasping portion Pd1 by spreading the first clasping portion Pd1. Since the pressed-in portion Pb2 of the first stick-shaped body Pb1 is clasped by the first clasping portion Pd1 when the first clasping portion Pd1 is fixed to a peripheral surface of the pressed-in portion Pb2, a situation in which the first central conductor Pb is fitted into the tubular body Pa is maintained.

The collar portion Pb3 of the first stick-shaped body Pb1 is configured to have an outside diameter greater than the inside diameter of the tubular body Pa and is greater than the pressed-in portion Pb2. This allows the collar portion Pb3 to be brought into contact with the end portion of the tubular body Pa to achieve positioning of the first stick-shaped body Pb1 when the first stick-shaped body Pb1 is inserted into the tubular body Pa to fit the first central conductor Pb therein.

In addition, referring to FIG. 3, the outside diameter of the collar portion Pb3 of the first stick-shaped body Pb1 is configured to be smaller than an inside diameter of each insert hole portion Ha of the support member 31 to allow the support member 31 to support the probe Pr when the tubular body Pa of the probe Pr has been inserted in the insert hole portions Ha. Further, the outside diameter of the collar portion Pb3 is configured to be greater than an inside diameter of the decreased diameter portion Ha1 defined in the support plate 31a to prevent the first central conductor Pb from coming off the support member 31 when the probe Pr has been supported by the support member 31.

The connection portion Pb4 of the first central conductor Pb is configured to have an outside diameter slightly smaller than the inside diameter of the decreased diameter portion Ha1 defined in the support plate 31a to allow the connection portion Pb4 to be inserted in the decreased diameter portion Ha1. In addition, the connection portion Pb4 is configured to have a total length greater than a length of the decreased diameter portion Ha1 defined in the support plate 31a to allow an end portion of the connection portion Pb4 to protrude outwardly of the support member 31 from the decreased diameter portion Ha1 when the probe Pr is supported by the support member 31. Further, a tapered portion Pb5 having a tapered shape is defined at an end portion of the connection portion Pb4 to allow a distal end surface of tapered portion Pb5 to make contact with the inspection point (bump BP) when the board 101 or the like is inspected as described below.

Meanwhile, the second central conductor Pc includes the second stick-shaped body Pc1, a pressed-in portion Pc2, and a collar portion Pc3, which are configured to have the same structures as those of the first stick-shaped body Pb1, the pressed-in portion Pb2, and the collar portion Pb3 of the first central conductor Pb. Then, a distal end surface of a connection portion Pc4, which is configured to be contiguous with the collar portion Pc3, is configured to be in contact with the electrode 34a formed on the base plate 321 at the time of an inspection, which will be described below.

The connection portion Pc4 is configured to have an outside diameter slightly smaller than an inside diameter of the narrow portion Hb defined in the support plate 31c to allow the connection portion Pc4 to be inserted in the narrow portion Hb. In addition, the connection portion Pc4 is configured to have a total length greater than a thickness of the support plate 31c to allow an end portion of the connection portion Pc4 to protrude outwardly of the support member 31 from the narrow portion Hb defined in the support plate 31c when the probe Pr is supported by the support member 31. Further, the distal end surface of the connection portion Pc4 is configured to be substantially flat.

The second stick-shaped body Pc1 of the second central conductor Pc is configured to have a total length greater than a range in which the second spring portion Pe2 of the tubular body Pa is formed. This allows a tip end portion of the second stick-shaped body Pc1 to be inserted into the joining portion Pf of the tubular body Pa when the second stick-shaped body Pc1 is inserted into the tubular body Pa to fit the second central conductor Pc therein.

In addition, the first stick-shaped body Pb1 and the second stick-shaped body Pc1 are configured to have such total lengths that a predetermined gap KG will be defined between a distal end surface of the first stick-shaped body Pb1 and a distal end surface of the second stick-shaped body Pc1 as illustrated in FIG. 4 when the first and second central conductors Pb and Pc have been fitted into the tubular body Pa.

Further, the first stick-shaped body Pb1 and the second stick-shaped body Pc1 are configured to have such total lengths that the distal end surface of the first stick-shaped body Pb1 and the distal end surface of the second stick-shaped body Pc1 will be kept in a separated state even when each of the connection portion Pb4 of the first central conductor Pb and the connection portion Pc4 of the second central conductor Pc has been pressed into the support member 31 (see FIG. 8) at the time of an inspection, which will be described below.

A length $\alpha$ of a body portion of the probe Pr, which is inserted and supported in the insert hole portions Ha defined in the support plates 31a and 31b, i.e., a sum of the total length of the tubular body Pa, the thicknesses of the collar portions Pb3 and Pc3 of the first and second central conductors Pb and Pc, may be configured to be equal to an insert hole length $\beta$ in a non-limiting embodiment, which is a sum of the total length of the insert hole portion Ha defined in the support plate 31a and the total length of the insert hole portion Ha defined in the support plate 31b.

Specifically, when the length $\alpha$ of the body portion of the probe Pr is configured to be greater than the insert hole length $\beta$ of the support plates 31a and 31b, the probe Pr may be attached to the support member 31 with the first and second spring portions Pe1 and Pe2 of the tubular body Pa being compressed by a length corresponding to a difference between the length $\alpha$ and the insert hole length $\beta$ (i.e., $\alpha-\beta$). This arrangement is advantageous in that the probe Pr can be stably held without shakiness in the insert hole portions Ha and Ha of the support plates 31a and 31b, but is disadvantageous in that an operation of attaching the probe Pr to the support member 31 is made troublesome.

Meanwhile, arranging the length $\alpha$ of the body portion of the probe Pr to be smaller than the insert hole length $\beta$ of the support plates 31a and 31b is advantageous in that the probe Pr can be easily attached to the support member 31 without the need to compress the first and second spring portions Pe1 and Pe2 of the tubular body Pa. On the other hand, this arrangement makes it difficult to stably hold the probe Pr in the insert hole portions Ha of the support plates 31a and 31b because, when the probe Pr has been attached to the support member 31, a gap is inevitably defined between the body portion of the probe Pr and a wall of the insert hole portion Ha of the support plate 31b, which easily leads to a shakiness of the probe Pr.

In contrast, arranging the length $\alpha$ of the body portion of the probe Pr and the insert hole length $\beta$ of the support plates 31a and 31b to be equal to each other with accuracy is advantageous in that the operation of attaching the probe Pr to the support member 31 is facilitated, and in that a shakiness of the probe Pr attached to the support member 31 can be prevented.

Figure 7:
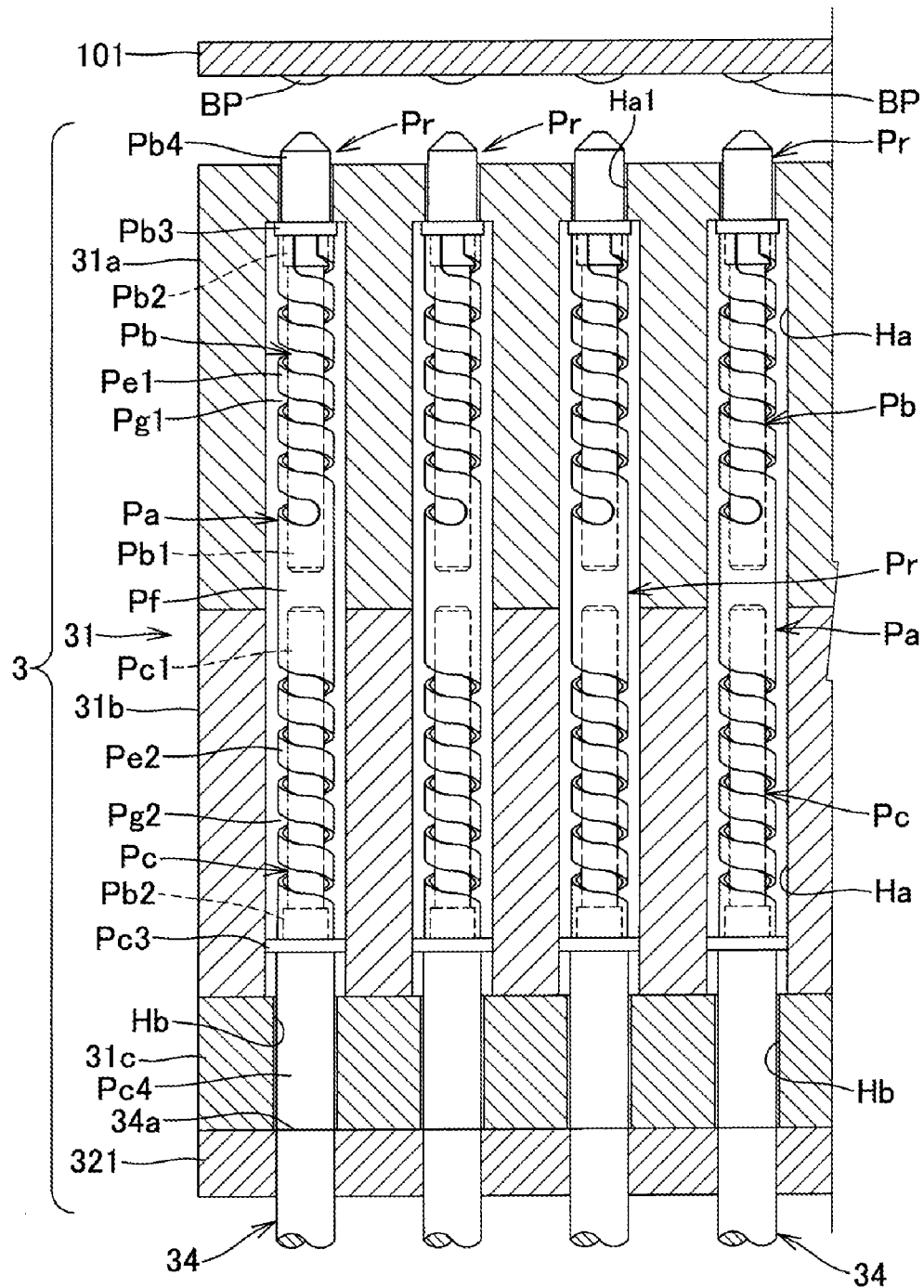
FIG. 7 is a diagram corresponding to FIG. 3, and illustrates a situation in which a base plate has been attached to a support member.

FIG. 7 is a schematic sectional view illustrating an example structure of the inspection jig 3, and illustrates a situation in which the base plate 321 has been attached to the support plate 31c of the support member 31.

Referring to FIG. 3, a rear end portion of the connection portion Pc4 of each second central conductor Pc slightly protrudes from the support plate 31c before the base plate 321 is attached to the support member 31. Then, referring to FIG. 7, when the base plate 321 is attached to the rear end portion (i.e., the lower side) of the support plate 31c, a rear end portion of each second central conductor Pc, i.e., the distal end surface of each connection portion Pc4, is brought into contact with the corresponding electrode 34a in the base plate 321, and is pressed toward the front end portion of the support member 31.

As a result, the first spring portion Pe1 and the second spring portion Pe2 of the tubular body Pa are compressed and elastically deformed, and thus, protruding portions of the connection portions Pc4 are pressed into the support member 31 against forces from the first and second spring portions Pe1 and Pe2. In addition, the rear end portion of each probe Pr, i.e., the rear end surface of the connection portion Pc4, is pressed against the corresponding electrode 34a in accordance with the forces from the first and second spring portions Pe1 and Pe2, so that the rear end portion of the probe Pr and the corresponding electrode 34a are kept in stable electrical contact with each other.

Since the distal end surface of the connection portion Pc4 is configured to be substantially flat and the electrode 34a is configured to be substantially flat, when the distal end surface thereof is pressed against the corresponding electrode, the flat surfaces are brought into contact with each other. As a result, a contact area of the distal end surface thereof and the corresponding electrode increases, and a contact resistance between the electrode 34a and the probe Pr is reduced.

The rear end surface of the connection portion Pc4 is not necessarily formed in the flat shape. For example, the rear end surface thereof may be formed in a crown shape, may be formed in a hemispherical shape, may be formed in a conical shape or a truncated cone shape, or may be formed in various shapes.

Figure 8:
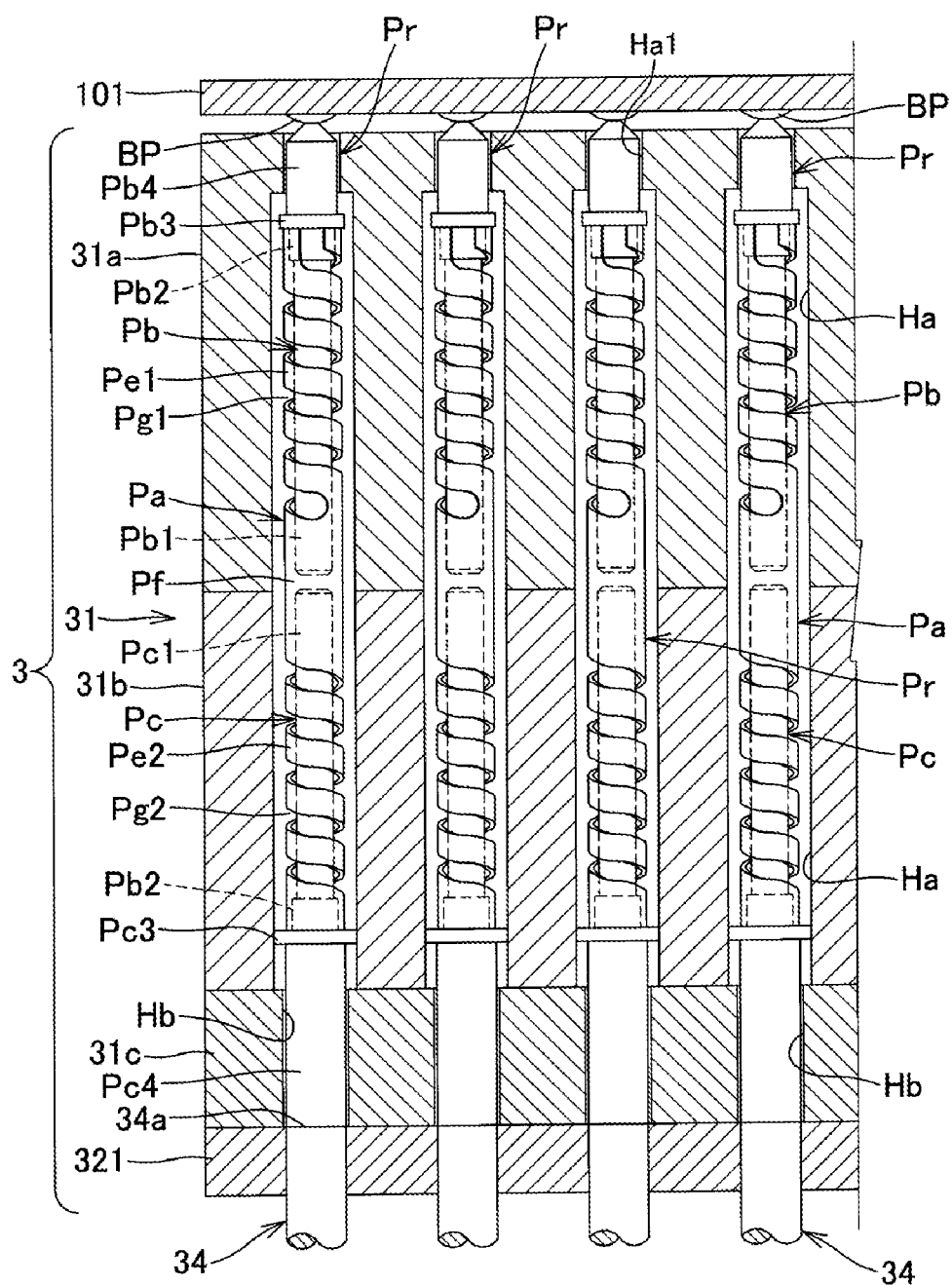
FIG. 8 is a diagram corresponding to FIG. 3, and illustrates a situation in which an inspection target is inspected with each probe being pressed against the inspection target.

FIG. 8 is a schematic sectional view illustrating a situation in which the board 101, which is the inspection target, is inspected with a front end portion of each probe Pr being pressed against a corresponding bump BP of the board 101.

At the time of inspecting the board 101 or the like using the probes Pr, if the inspection jig 3 is pressed against the board 101 with the support member 31 being positioned with respect to the board 101, the connection portion Pb4 of the first central conductor Pb, which is at the front end portion of each probe Pr, is brought into contact with the corresponding bump BP of the board 101, and is pressed toward the rear end portion of the support member 31.

As a result, the first spring portion Pe1 and the second spring portion Pe2 of the tubular body Pa are further compressed and elastically deformed, and thus, a protruding portion of the connection portion Pb4 is pressed toward the rear end portion of the support member 31 against the forces from the first and second spring portions Pe1 and Pe2. Then, with the front end portion of each probe Pr, i.e., a distal end surface of the connection portion Pb4 of each probe Pr, being pressed against the corresponding bump BP of the board 101 in accordance with the forces from the first and second spring portions Pe1 and Pe2, the front end portion of each probe Pr and the corresponding inspection point (i.e., the corresponding bump BP) in the board 101 are kept in stable electrical contact with each other.

As stated above, the tubular body Pa which is tubular and is made of the electrically conductive material and the first and second central conductors Pb and Pc each of which is made of the electrically conductive material and is in the shape of a stick are provided. The first and second central conductors Pb and Pc include the first and second stick-shaped bodies Pb1 and Pc1 inserted into the tubular body Pa, respectively. The tubular body Pa includes the first and second spring portions Pe1 and Pe2 which are defined by the helical bodies arranged by forming the first and second helical grooves Pg1 and Pg2 along the circumference of the tubular body Pa, respectively, and the first and second clasping portions Pd1 and Pd2 which are fitted onto the proximal end portions of the first and second stick-shaped bodies Pb1 and Pc1 to clasp the proximal end portions thereof. The first and second clasping portions Pd1 and Pd2 are defined by the circumferential wall of the tubular body Pa at which the portions of the tubular body are separated by the slits Ph1 and Ph2 formed at the end portion of the tubular body Pa in a circumferential direction of the tubular body Pa. With such a structure, the probes Pr (i.e., contact terminals) used to inspect the board 101 or the like can be easily and appropriately manufactured, and the contact pressure of the probe Pr applied to the inspection point of the board 101 and the electrode 34a of the wire 34 can be configured to have an appropriate value.

For example, the pressed-in portion Pb2 of the first central conductor Pb can be easily press fitted into the first clasping portion Pd1 by spreading the slit Ph1 and thus elastically deforming the first clasping portion Pd1 of the tubular body Pa when the first stick-shaped body Pb1 of the first central conductor Pb is inserted and fitted into the first end portion of the tubular body Pa. In addition, because the first clasping portion Pd1 is fixed to the peripheral surface of the pressed-in portion Pb2 with pressure in accordance with resilience of the first clasping portion Pd1, the fitting of the first central conductor Pb to the tubular body Pa can be stably maintained with the first clasping portion Pd1 clasping the pressed-in portion Pb2 of the first stick-shaped body Pb1.

Similarly, the pressed-in portion Pc2 of the second central conductor Pc can be easily press fitted into the second clasping portion Pd2 by spreading the slit Ph2 and thus elastically deforming the second clasping portion Pd2 of the tubular body Pa when the second stick-shaped body Pc1 of the second central conductor Pc is inserted and fitted into the second end portion of the tubular body Pa. In addition, because the second clasping portion Pd2 is fixed to the peripheral surface of the pressed-in portion Pc2 with pressure in accordance with resilience of the second clasping portion Pd2, the fitting of the second central conductor Pc to the tubular body Pa can be stably maintained with the second clasping portion Pd2 clasping the second pressed-in portion Pc2 of the second stick-shaped body Pc1.

Accordingly, it is possible to easily manufacture the probes (i.e., contact terminals) Pr capable of pressing the distal end surface of the first stick-shaped body Pb1 and the distal end surface of the second stick-shaped body Pc1 against the bump BP and the electrode 34a of the board 101 with an appropriate pressure in accordance with the forces of the first and second spring portions by elastically deforming the first and second spring portions Pe1 and Pe2 formed at the tubular body Pa.

The pressed-in portions Pb2 and Pc2 formed at the proximal end portions of the first and second stick-shaped bodies Pb1 and Pc1 are omitted, and the proximal end portions of the first and second stick-shaped bodies Pb1 and Pc1 can be directly clasped by the first and second clasping portions Pd1 and Pd2 of the tubular body Pa.

However, when the first and second stick-shaped bodies Pb1 and Pc1 are configured to have the outside diameters smaller than the inside diameters of the first and second clasping portions Pd1 and Pd2 of the tubular body Pa as stated above, it is possible to easily fit the first and second central conductors Pb and Pc by smoothly inserting the first and second stick-shaped bodies Pb1 and Pc1 into the tubular body Pa. When the pressed-in portions Pb2 and Pc2 having the outside diameters greater than the inside diameters of the first and second clasping portions Pd1 and Pd2 when the first stick-shaped body Pb1 is not inserted into the tubular body Pa are formed at the proximal end portions of the first and second stick-shaped bodies Pb1 and Pc1, it is possible to stably clasp the pressed-in portions Pb2 and Pc2 by the first and second clasping portions Pd1 and Pd2 by fixing the first and second clasping portions Pd1 and Pd2 of the tubular body Pa to the peripheral surfaces of the pressed-in portions Pb2 and Pc2.

The collar portions Pb3 and Pc3 of the first and second central conductors Pb and Pc may be omitted. However, provision of the collar portions Pb3 and Pc3 enables the first and second central conductors Pb and Pc to be positioned through the collar portions Pb3 and Pc3 when the first and second stick-shaped bodies Pb1 and Pc1 are inserted into the tubular body Pa to fit the first and second central conductors Pb and Pc therein, thus facilitating this fitting operation.

In addition, in the case where the first slit Ph1, which is defined in the first clasping portion Pd1, is configured to be contiguous with an end portion of the first helical groove Pg1, which defines the first spring portion Pe1, and extends in the axial direction of the tubular body Pa, and the second slit Ph2, which is defined in the second clasping portion Pd2, is configured to be contiguous with an end portion of the second helical groove Pg2, which defines the second spring portion Pe2, and extends in the axial direction of the tubular body Pa as described above, the first and second slits Ph1 and Ph2 can be easily defined contiguously with the first and second helical grooves Pg1 and Pg2, respectively, when, for example, the laser beam is emitted from the laser beam machine onto the circumference of the tubular body Pa to define the first and second helical grooves Pg1 and Pg2.

Note that, although each of the first and second slits Ph1 and Ph2 is configured to extend substantially in parallel with the axial direction of the tubular body Pa in the above-described first non-limiting embodiment, each of the first and second slits Ph1 and Ph2 may alternatively be configured to extend at a predetermined angle with respect to the axial direction of the tubular body Pa.

A structure in which a single central conductor and a single clasping portion are formed as described below may be provided instead of the first non-limiting embodiment in which the first central conductor Pb having the first stick-shaped body Pb1 which is inserted into and clasped to the first end portion of the tubular body Pa and the second central conductor Pc having the second stick-shaped body Pc1 which is inserted into and clasped to the second end portion of the tubular body Pa are formed and the first and second clasping portions Pd1 and Pd2 are formed at both the end portion of the tubular body Pa.

However, as illustrated in the first non-limiting embodiment, the first and second central conductors Pb and Pc are provided separately, and the first and second clasping portions Pd1 and Pd2 at both the end portions of the tubular body Pa are configured to clasp the proximal end portions of the first and second stick-shaped bodies Pb1 and Pc1, respectively. Accordingly, when compared to the case where the single central conductor is provided, each of the first and second stick-shaped bodies Pb1 and Pc1, which form the first and second central conductors Pb and Pc, can be configured to have a small total length, and the first and second stick-shaped bodies Pb1 and Pc1 can be easily inserted into the tubular body Pa through both end portions thereof to fit the first and second central conductors Pb and Pc in the tubular body Pa.

As stated above, when the first spring portion Pe1 configured to be contiguous with the first clasping portion Pd1, the second spring portion Pe2 configured to be contiguous with the second clasping portion Pd2, and the tubular joining portion Pf that joins the first and second spring portions Pe1 and Pe2 to each other are formed at the tubular body Pa, the tip end portion of the first and second stick-shaped bodies Pb1 and Pc1 of the first and second central conductors Pb and Pc are inserted into the joining portion Pf of the tubular body Pa, and a state in which the distal end surfaces of the first and second stick-shaped bodies Pb1 and Pc1 face each other with the predetermined gap KG is maintained, the first and second central conductors Pb and Pc are connected to the first and second spring portions Pe1 and Pe2 in parallel.

Since each of the first and second spring portions has a coil shape, has a high impedance, and has a long current path, the electric current flowing through the probes Pr does not easily flow to the first and second spring portions Pe1 and Pe2 having a large resistance value. Since each of the first and second central conductors Pb and Pc is a linear shape, has a low impedance, and has a short current path, the electric current easily flows to the first and second central conductors Pb and Pc.

As a result, since it is possible to reduce the electric current flowing to the first and second spring portions Pe1 and Pe2 having the high impedance and the large resistance value at the time of inspecting the board 101 or the like using the probes Pr, it is possible to effectively improve inspection accuracy using the probes Pr by suppressing the impedance in the first and second spring portions Pe1 and Pe2 from increasing.

For example, it is possible to provide a structure in which the joining portion Pf is omitted and the spring portions defined by the helical bodies are formed at substantially the overall tubular body Pa except for the installation portions of the first and second clasping portions Pd1 and Pd2. However, in such a configuration, since the electric current easily flows to the long spring portions at the time of inspecting the board 101 or the like using the probes Pr, there is a possibility that the impedance thereof will be high and the inspection accuracy will be degraded due to the occurrence of eddy current.

In contrast, when the tip end portions of the first and second stick-shaped bodies Pb1 and Pc1 are positioned within the joining portion Pf and the tip end portions of the first and second stick-shaped bodies Pb1 and Pc1 are brought into contact with the joining portion Pf as in the first non-limiting embodiment, it is possible to establish electrical connection between the first central conductor Pb and the second central conductor Pc while reducing the electric current flowing to the first and second spring portions Pe1 and Pe2 at the time of inspecting the board 101 or the like using the probes Pr. As a result, it is possible to increase the impedance in the first and second spring portions Pe1 and Pe2, and it is possible to reduce the occurrence of eddy current.

The total length of the first and second stick-shaped bodies Pb1 and Pc1 is configured such that the tip end portions reach the inside of the joining portion Pf of the tubular body Pa when the first and second central conductors Pb and Pc have been fitted into the tubular body Pa, and thus, it is possible to reinforce substantially the overall tubular body Pa by using the first and second stick-shaped bodies Pb1 and Pc1. Accordingly, it is possible to improve mechanical strength of the probes Pr.

When the first and second spring portions Pe1 and Pe2 are compressed and deformed at the time of inspecting the board 101 or the like using the probes Pr, the distal end surfaces of the first and second stick-shaped bodies Pb1 and Pc1 are brought into contact with each other, and thus, the compression and deformation of the first and second spring portions Pe1 and Pe2 are inhibited at the time of the contact. Thus, even when the first and second spring portions Pe1 and Pe2 are compressed and deformed at the time of inspecting the board 101 or the like using the probes Pr, the total length of the first and second stick-shaped bodies Pb1 and Pc1 may be configured such that the distal end surfaces of the first and second stick-shaped bodies Pb1 and Pc1 are separated from each other in a non-limiting embodiment.

Second Non-Limiting Embodiment

Figure 9:
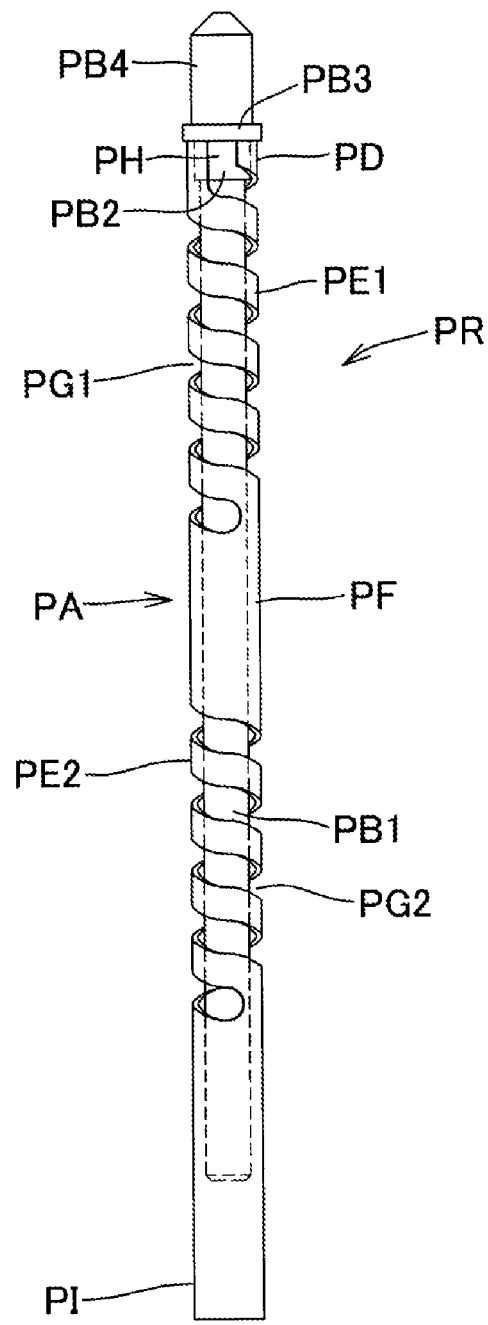
FIG. 9 is a diagram corresponding to FIG. 4, and illustrates an example structure of a probe according to a second non-limiting embodiment of the present disclosure.
Figure 10:
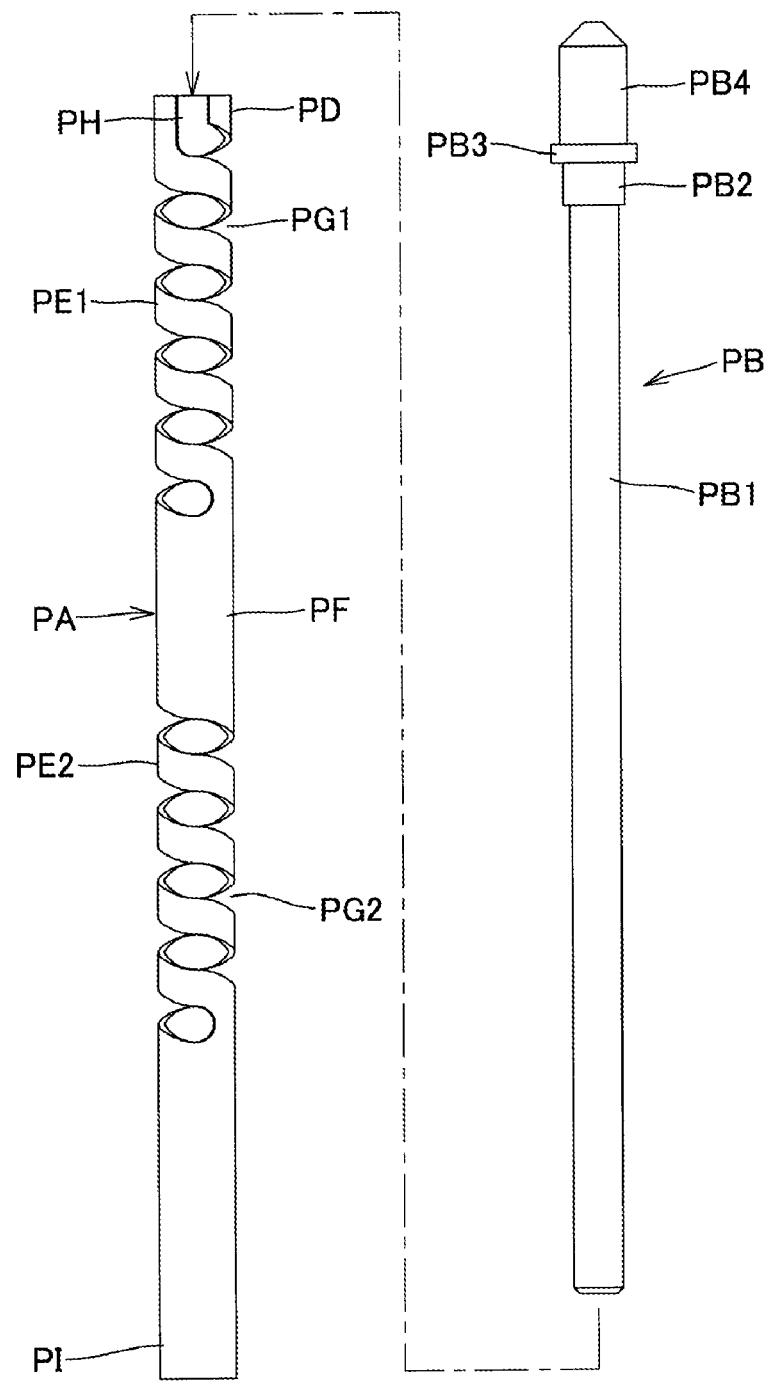
FIG. 10 is a diagram corresponding to FIG. 5, and illustrates an example structure of the probe according to the second non-limiting embodiment of the present disclosure.
Figure 11:
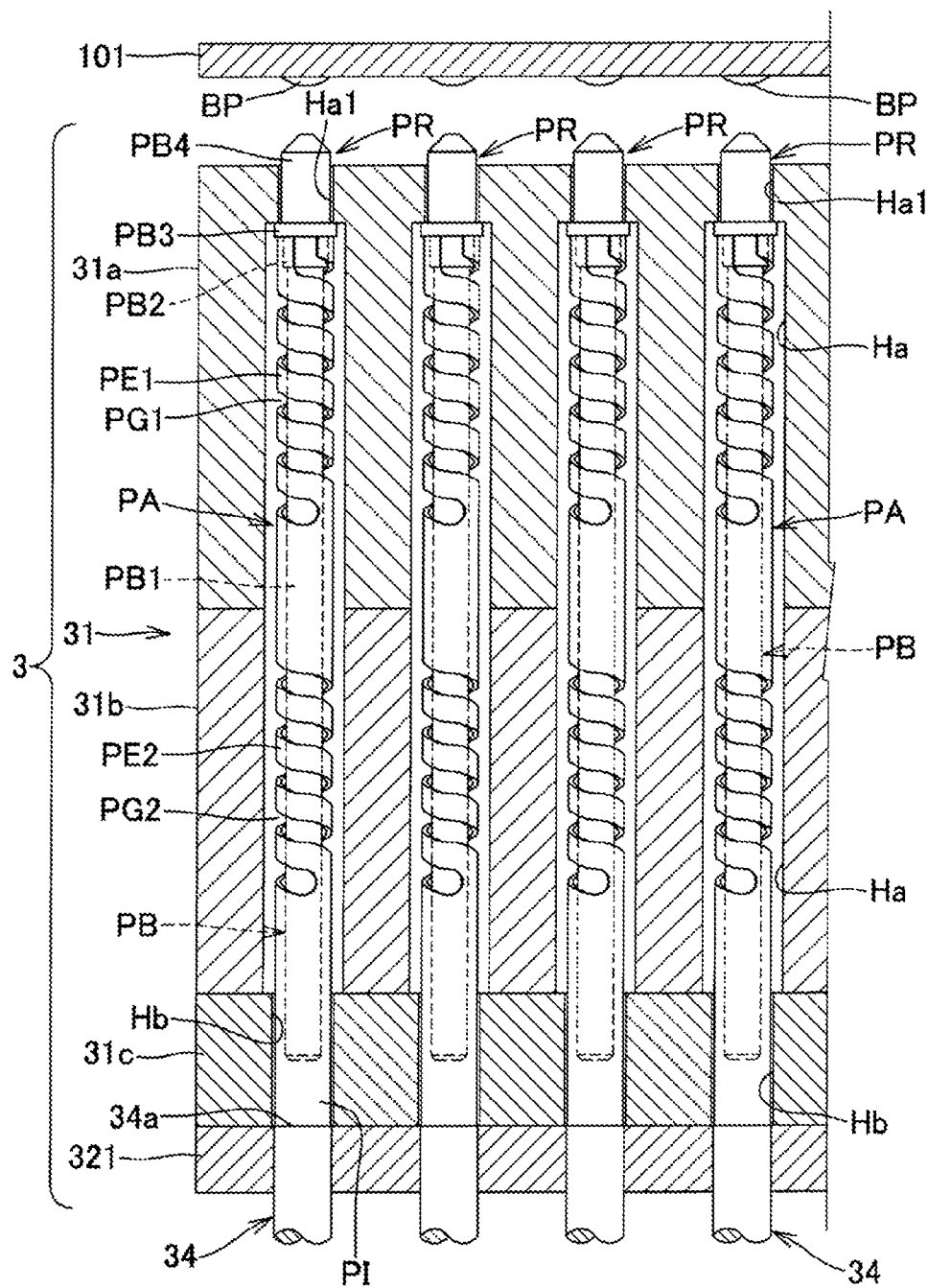
FIG. 11 is a diagram corresponding to FIG. 7, and illustrates an example structure of the probe according to the second non-limiting embodiment of the present disclosure.

FIG. 9 is a schematic plan view illustrating a structure of a probe (i.e., contact terminal) PR according to a second non-limiting embodiment of the present disclosure. FIG. 10 is an explanatory exploded view of the probe PR, illustrating a tubular body PA and a central conductor PB separately. FIG. 11 illustrates a situation in which the probes PR are fitted into the support member 31 and the base plate 321 is attached to the support member 31.

The second non-limiting embodiment is different from the first non-limiting embodiment in that the probe PR includes the tubular body PA which is made of an electrically conductive material and is tubular and the single central conductor PB which is made of an electrically conductive material and is in the shape of a stick, the central conductor PB is not divided into the first central conductor and the second central conductor, and the clasping portions are not formed at a rear end portion PI of the tubular body PA. The total length of the tubular body PA is greater than that of tubular body Pa according to the first non-limiting embodiment.

The central conductor PB includes a stick-shaped body PB1 configured to be inserted into the tubular body PA, a pressed-in portion PB2 formed at a proximal end portion thereof, a collar portion PB3 configured to be contiguous with the pressed-in portion PB2, and a connection portion PB4 configured to be contiguous with the collar portion PB3, and is substantially similar to the first central conductor Pb according to the first non-limiting embodiment except that a total length of the stick-shaped body PB1 is greater than that of the first stick-shaped body Pb1 according to the first non-limiting embodiment.

Referring to FIG. 9, the stick-shaped body PB1 of the central conductor PB is inserted into the tubular body PA, and the pressed-in portion PB2 formed at the proximal end portion is pressed in and clasped to the clasping portion PD formed at a first end portion of the tubular body PA. Thus, the probe PR in which the connection portion PB4 of the central conductor PB is supported while protruding from a front end of the tubular body PA is provided.

Referring to FIG. 11, the contact terminals defined by the probes PR are inserted and fitted into the insert hole portions Ha and Ha formed in the support member 31. Specifically, the probes PR are fitted into the support member 31 in a state in which the connection portions PB4 formed at the front end portions of the probes PR are inserted into decreased diameter portions Ha1 formed in the support plate 31a, the tip end portions thereof protrude outwardly of the support member 31 from opening portions of the decreased diameter portions Ha1, and the rear end portions PI of the tubular bodies PA are brought into contact with the electrodes 34a formed at the base plate 321.

As stated above, in the second non-limiting embodiment in which the probe PR includes the tubular body PA and the single central conductor PB, since it is possible to further reduce the number of components as compared to the first non-limiting embodiment, it is possible to simplify the structure of the contact terminal defined by the probe PR.

Third Non-Limiting Embodiment

Figure 12:
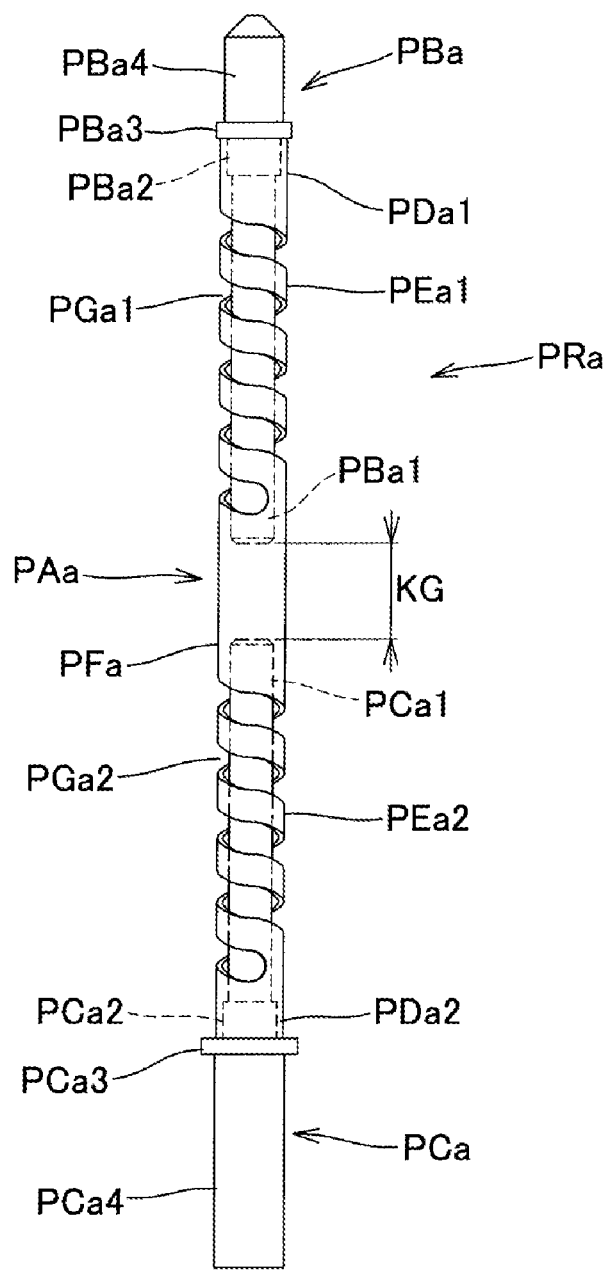
FIG. 12 is a diagram corresponding to FIG. 4, and illustrates an example structure of an inspection jig according to a third non-limiting embodiment of the present disclosure.

FIG. 12 is a front view illustrating an example structure of a probe (i.e., contact terminal) PRa according to a third non-limiting embodiment of the present disclosure.

The probe PRa includes a tubular body PAa substantially similar to the tubular body Pa according to the first non-limiting embodiment except that the slits Ph1 and Ph2 are not formed in both the end portions, and first and second central conductors PBa and PCa similar to the first and second central conductors Pb and Pc according to the first non-limiting embodiment.

That is, the first central conductor PBa includes a first stick-shaped body PBa1 similar to the first stick-shaped body Pb1 according to the first non-limiting embodiment, a pressed-in portion PBa2 formed at a proximal end portion thereof, a collar portion PBa3 configured to be contiguous with the pressed-in portion PBa2, and a connection portion PBa4 configured to be contiguous with the collar portion PBa3. The second central conductor PCa includes a second stick-shaped body PCa1 similar to the second stick-shaped body Pc1 according to the first non-limiting embodiment, a pressed-in portion PCa2 formed at a proximal end portion thereof, a collar portion PCa3 configured to be contiguous with the pressed-in portion PCa2, and a connection portion PCa4 configured to be contiguous with the collar portion PCa3.

The tubular body PAa includes first and second spring portions PEa1 and PEa2 which are defined by first and second helical grooves PGa1 and PGa2, respectively, and a joining portion PFa between both the spring portions PEa1 and PEa2. In addition, both end portions of the tubular body PAa include clasping portions defined by circumferential walls thereof, i.e., first and second clasping portion PDa1 and PDa2, respectively, each of which is tubular and does not include a cut portion as mentioned above.

The first and second stick-shaped bodies PBa1 and PCa1 are inserted into the tubular body PAa. The first and second clasping portions PDa1 and PDa2 are fixed to peripheral surfaces of the pressed-in portions PBa2 and PCa2 by pressing the pressed-in portions PBa2 and PCa2 of the first and second central conductors PBa and PCa into the first and second clasping portions PDa1 and PDa2 of the tubular body PAa and spreading the first and second clasping portions PDa1 and PDa2. As a result, the first and second clasping portions PDa1 and PDa2 are configured to clasp the pressed-in portions PBa2 and PCa2 of the first and second stick-shaped bodies PBa1 and PCa1, respectively.

The probe PRa may be provided by omitting the pressed-in portions PBa2 and PCa2, inserting the first and second stick-shaped bodies PBa1 and PCa1 into the tubular body PAa, and connecting the proximal end portions, the end portions of the tubular body PAa, that is, the first and second clasping portions PDa1 and PDa2 to each other through other connection means such as welding or crimping.

In addition, the first stick-shaped body PBa1 and the second stick-shaped body PCa1 are configured to have such total lengths that a predetermined gap KG will be defined between a distal end surface of the first stick-shaped body PBa1 and a distal end surface of the second stick-shaped body PCa1 as illustrated in FIG. 12 when the first and second central conductors PBa and PCa have been fitted into the tubular body PAa.

As stated above, in the probe PRa including the tubular body PAa which is made of the electrically conductive material and is tubular and the first and second central conductors PBa and PCa each of which is made of the electrically conductive material and is in the shape of a stick, the first central conductor PBa includes the first stick-shaped body PBa1 inserted into the first end portion of the tubular body PAa, and the second central conductor PCa includes the second stick-shaped body PCa1 inserted into the second end portion of the tubular body PAa. The tubular body PAa includes the first clasping portion PDa1 which clasps the proximal end portion of the first stick-shaped body PBa1 at the first end portion thereof, the second clasping portion PDa2 which clasps the proximal end portion of the second stick-shaped body PCa1 at the second end portion of the tubular body PAa, the first spring portion PEa1 configured to be contiguous with the first clasping portion PDa1, the second spring portion PEa2 configured to be contiguous with the second clasping portion PDa2, and the tubular joining portion PFa which joins the first and second spring portions PEa1 and PEa2 to each other. The first and second central conductors PBa and PCa are fitted in a state in which the tip end portions of the first and second stick-shaped bodies PBa1 and PCa1 are inserted in the joining portion PFa of the tubular body PAa, and the total length of the first and second stick-shaped bodies PBa1 and PCa1 is configured such that a state in which the distal end surfaces of the first and second stick-shaped bodies PBa1 and PCa1 face each other with the gap KG is maintained. With such a structure, since the total length of the first and second stick-shaped bodies PBa1 and PCa1 which form the first and second central conductors PBa and PCa can be further reduced when compared to the case where the single central conductor PB is provided as the second non-limiting embodiment, it is possible to facilitate an operation for inserting the first and second stick-shaped bodies into both the end portions of the tubular body PAa to fit the first and second central conductors PBa and PCa therein.

It is possible to establish electrical connection between the first central conductor PBa and the second central conductor PCa while reducing the electric current flowing to the first and second spring portions PEa1 and PEa2 by bringing the tip end portions of the first and second stick-shaped bodies PBa1 and PCa1 into contact with the joining portion PFa formed at the tubular body PAa at the time of inspecting the board 101 or the like using the probes PRa. As a result, it is possible to effectively improve the inspection accuracy using the probes PRa by increasing the impedance of the probes PRa or suppressing the occurrence of the eddy current. The total length of the first and second stick-shaped bodies PBa1 and PCa1 is configured such that the tip end portions reach the inside of the joining portion PFa of the tubular body PAa when the first and second central conductors PBa and PCa are fitted into the tubular body PAa, and thus, it is possible to reinforce substantially the overall tubular body Pa by using the first and second stick-shaped bodies. Accordingly, it is possible to improve the mechanical strength of the probes PRa.

That is, a contact terminal according to a first aspect of the present disclosure includes a tubular body that is made of an electrically conductive material and is tubular, and a central conductor that is made of an electrically conductive material and is in a shape of a stick. The central conductor includes a stick-shaped body inserted into the tubular body. The tubular body includes a spring portion defined by a helical body configured such that a helical groove is formed along a circumference of the tubular body, and a clasping portion that is fitted on a proximal end portion of the stick-shaped body to clasp the proximal end portion. The clasping portion is defined by a circumferential wall at which portions are separated by a slit formed in an end portion of the tubular body in a circumferential direction of the tubular body.

With such a structure, it is easy to appropriately manufacture the contact terminal used to inspect the semiconductor device or the like by clasping the proximal end portion of the stick-shaped body to the clasping portion of the tubular body. It is easy to configure the contact pressure of the contact terminal applied to the inspection point of the semiconductor device and the electrode of the wire to be the appropriate value by elastically deforming the spring portion of the tubular body.

The stick-shaped body of the central conductor may be configured to have an outside diameter less than an inside diameter of the clasping portion of the tubular body, and a pressed-in portion configured to have an outside diameter greater than the inside diameter of the clasping portion of the tubular body in a state in which the stick-shaped body is not inserted is formed at the proximal end portion of the stick-shaped body in a non-limiting embodiment.

With such a structure, it is easy to fit the central conductor by smoothly inserting the stick-shaped body into the tubular body at the time of fitting the central conductor into the tubular body. In addition, it is possible to stably clasp the pressed-in portion to the clasping portion by fixing the clasping portion of the tubular body to the peripheral surface of the pressed-in portion formed at the central conductor.

The slit may be configured to be contiguous with an end portion of the helical groove which defines the spring portion, and may extend in an axial direction of the tubular body.

With such a structure, it is possible to easily form the slit contiguously with the helical groove at the time of forming the helical groove by emitting the laser beam from, for example, the laser beam machine onto the circumference of the tubular body.

The central conductor may include a first central conductor that includes a first stick-shaped body inserted into a first end portion of the tubular body, and a second central conductor that includes a second stick-shaped body inserted into a second end portion of the tubular body, and a first clasping portion that clasps a proximal end portion of the first stick-shaped body at a first end portion and a second clasping portion that clasps a proximal end portion of the second stick-shaped body at a second end portion of the tubular body are formed at the tubular body in a non-limiting embodiment.

With such a structure, it is possible to facilitate the operation for inserting the first and second stick-shaped bodies into both the end portions of the tubular body to fit the first and second central conductors by reducing the total length of the first and second stick-shaped bodies which define the first and second central conductors when compared to a case where the single central conductor is provided.

A first spring portion may be configured to be contiguous with the first clasping portion, a second spring portion configured to be contiguous with the second clasping portion, and a tubular joining portion that joins the first and second spring portions to each other are formed at the tubular body, and in the first and second central conductors, tip end portions of the first and second stick-shaped bodies are inserted into the joining portion of the tubular body, and the first and second stick-shaped bodies are configured to have a total length such that a state in which distal end surfaces of both the stick-shaped bodies face each other a gap is maintained in a non-limiting embodiment.

With such a structure, since the electric current easily flows to the second central conductor from the first central conductor through the joining portion at the time of inspecting the board or the like using the contact terminals, it is possible to establish electrical connection between the first central conductor and the second central conductor through the joining portion while reducing the electric current flowing to the first and second spring portions of the tubular body. Thus, it is possible to increase the impedance in the spring portions, and it is possible to reduce the occurrence of the eddy current. As a result, it is possible to effectively improve the inspection accuracy using the contact terminals. In addition, since it is possible to reinforce substantially the overall tubular body by using the first and second stick-shaped bodies when the central conductor is fitted to the tubular body, it is possible to sufficiently secure the mechanical strength of the contact terminals.

A contact terminal according to another aspect of the present disclosure includes a tubular body which is made of an electrically conductive material, and is tubular, and a central conductor which is made of an electrically conductive material and is a shape of a stick. The central conductor includes a first central conductor that includes a first stick-shaped body inserted into a first end portion of the tubular body, and a second central conductor that includes a second stick-shaped body inserted into a second end portion of the tubular body. The tubular body includes a first clasping portion that clasps a proximal end portion of the first stick-shaped body at a first end portion, a second clasping portion that clasps a proximal end portion of the second stick-shaped body at a second end portion of the tubular body, a first spring portion configured to be contiguous with the first clasping portion, a second spring portion configured to be contiguous with the second clasping portion, and a tubular joining portion that joins the first and second spring portions to each other. In the first and second central conductors, tip end portions of the first and second stick-shaped bodies are inserted into the joining portion of the tubular body, and the first and second stick-shaped bodies are configured to have a total length such that a state in which distal end surfaces of both the stick-shaped bodies face each other a gap is maintained.

With such a structure, since it is possible to reduce the total length of the first and second stick-shaped bodies which define the central conductors when compared to a case where the single central conductor is provided, it is possible to facilitate the operation for inserting the first and second stick-shaped bodies into both the end portions of the tubular body to fit the first and second central conductors. The total length of the first and second stick-shaped bodies is configured such that the tip end portions reach the inside of the joining portion of the tubular body when the first and second central conductors are fitted into the tubular body, and thus, it is possible to reinforce substantially the overall tubular body by using the first and second stick-shaped bodies. Accordingly, it is possible to improve the mechanical strength of the probes.

In addition, it is possible to establish the electrical connection between the first central conductor and the second central conductor while reducing the electric current flowing to the first and second spring portions by bringing the tip end portions of the first and second stick-shaped bodies into contact with the joining portion formed at the tubular body at the time of inspecting the board or the like using the contact terminals. Accordingly, it is possible to increase the impedance in the spring portions, and it is possible to reduce the occurrence of the eddy current. As a result, it is possible to effectively improve the inspection accuracy using the contact terminals.

An inspection jig according to still another aspect of the present disclosure includes the contact terminal, and a support member that supports the contact terminal.

With such a structure, it is easy to appropriately manufacture the inspection jig used to inspect the inspection target such as the semiconductor device, and it is easy to configure the contact pressure of the contact terminal applied to the inspection point of the inspection target and the electrode of the wire to be the appropriate value.

An inspection device according to still another aspect of the present disclosure includes the inspection jig, and an inspection processing unit that inspects an inspection target based on an electric signal obtained by bringing the contact terminal into contact with an inspection point formed at the inspection target.

With such a structure, it is easy to appropriately manufacture the inspection device used to inspect the inspection target, and it is easy to configure the contact pressure of the contact terminal applied to the inspection point of the inspection target and the electrode of the wire to be the appropriate value.

The contact terminal, the inspection jig, and the inspection device having such configurations are easy to be appropriately manufactured, and are easy to configure the contact pressure of the contact terminal applied to the electrode and the inspection target to be the appropriate value.

The specific embodiments or examples described in the "DETAILED DESCRIPTION" are merely intended to clarify the technical content of the present disclosure, and the present disclosure should not be interpreted in a narrow sense by limiting to such specific examples.

REFERENCE SIGNS LIST 1 board inspection device
3, 3U, 3D inspection jig
KG gap
Pa, PA, PAa tubular body
Pb, PBa first central conductor
Pc, PCa second central conductor
PB central conductor
Pb1, PBa1 first stick-shaped body
Pc1, PCa1 second stick-shaped body
PB1 stick-shaped body
Pb2, Pc2, PB2, PBa2, PCa2 pressed-in portion
Pb3, Pc3, PB3, PBa3, PCa3 collar portion
Pb4, Pc4, PB4, PBa4, PCa4 connection portion
Pd1, PDa1 first clasping portion
Pd2, PDa2 second clasping portion
PD clasping portion
Pe1, PE1 PEa1 first spring portion
Pe2, PE2, PEa2 second spring portion
Pf, PF, PFa joining portion
Pg1, PG1, PGa1 first helical groove
Pg2, PG2, PGa2 second helical groove
Ph1 first slit
Ph2 second slit
PH slit
Pr, PR, PRa probe

The invention claimed is:

1. A contact terminal comprising:
a tubular body that is made of an electrically conductive material and is tubular; and
a central conductor that is made of an electrically conductive material and is in a shape of a rod,
wherein
the central conductor comprises a rod-shaped body inserted into the tubular body,
the tubular body comprises:
a spring portion defined by a helical body formed by a helical groove along a circumference of the tubular body, and
a clasping portion that is fitted on a proximal end portion of the rod-shaped body to clasp the proximal end portion, and
the clasping portion is defined by a circumferential wall at which portions are separated by a slit formed in an end portion of the tubular body in a circumferential direction of the tubular body.

2. The contact terminal according to claim 1, wherein
the rod-shaped body of the central conductor has an outside diameter less than an inside diameter of the clasping portion of the tubular body, and
the rod-shaped body of the central conductor comprises a pressed-in portion formed at the proximal end portion of the rod-shaped body, the pressed-in portion configured to have an outside diameter greater than the inside diameter of the clasping portion of the tubular body in a state in which the rod-shaped body is not inserted into the tubular body.

3. The contact terminal according to claim 1, wherein
the slit is contiguous with an end portion of the helical groove which defines the spring portion, and extends in an axial direction of the tubular body.

4. The contact terminal according to claim 1, wherein
the central conductor comprises a first central conductor that comprises a first rod-shaped body inserted into a first end portion of the tubular body, and a second central conductor that comprises a second rod-shaped body inserted into a second end portion of the tubular body, and
the tubular body comprises a first clasping portion that clasps a proximal end portion of the first rod-shaped body at the first end portion and a second clasping portion that clasps a proximal end portion of the second rod-shaped body at the second end portion.

5. The contact terminal according to claim 4, wherein
the tubular body comprises a first spring portion that is contiguous with the first clasping portion, a second spring portion that is contiguous with the second clasping portion, and a tubular joining portion that joins the first and second spring portions to each other, and in the first and second central conductors, tip end portions of the first and second rod-shaped bodies are inserted into the joining portion of the tubular body, and the first and second rod-shaped bodies have a total length such that a state in which distal end surfaces of both the rod-shaped bodies face each other a gap is maintained.

6. A contact terminal comprising:

a tubular body which is made of an electrically conductive material and is tubular; and first and second central conductors each of which is made of an electrically conductive material and is in a shape of a rod, wherein
the first central conductor comprises a first rod-shaped body inserted into a first end portion of the tubular body, and
the second central conductor comprises a second rod-shaped body inserted into a second end portion of the tubular body,
the tubular body comprises:
a first clasping portion that clasps a proximal end portion of the first rod-shaped body at the first end portion,
a second clasping portion that clasps a proximal end portion of the second rod-shaped body at the second end portion of the tubular body,
a first spring portion contiguous with the first clasping portion,
a second spring portion contiguous with the second clasping portion, and
a tubular joining portion that joins the first and second spring portions to each other, and
in the first and second central conductors, tip end portions of the first and second rod-shaped bodies are inserted into the joining portion of the tubular body, and the first and second rod-shaped bodies have a total length such that a state in which distal end surfaces of both the rod-shaped bodies face each other a gap is maintained.

7. An inspection jig comprising:
the contact terminal according to claim 6; and
a support member that supports the contact terminal.

8. An inspection device comprising:
the inspection jig according to claim 7; and
an inspection processing unit that inspects an inspection target based on an electric signal obtained by bringing the contact terminal into contact with an inspection point formed at the inspection target.

9. An inspection jig comprising:
the contact terminal according to claim 1; and
a support member that supports the contact terminal.

10. An inspection device comprising:
the inspection jig according to claim 9; and
an inspection processing unit that inspects an inspection target based on an electric signal obtained by bringing the contact terminal into contact with an inspection point formed at the inspection target.

11. The contact terminal according to claim 2, wherein
the slit is contiguous with an end portion of the helical groove which defines the spring portion, and extends in an axial direction of the tubular body.

12. The contact terminal according to claim 11, wherein
the central conductor comprises a first central conductor that comprises a first rod-shaped body inserted into a first end portion of the tubular body, and a second central conductor that comprises a second rod-shaped body inserted into a second end portion of the tubular body, and
the tubular body comprises a first clasping portion that clasps a proximal end portion of the first rod-shaped body at the first end portion and a second clasping portion that clasps a proximal end portion of the second rod-shaped body at the second end portion.

13. The contact terminal according to claim 12, wherein
the tubular body comprises a first spring portion that is contiguous with the first clasping portion, a second spring portion that is contiguous with the second clasping portion, and a tubular joining portion that joins the first and second spring portions to each other, and
in the first and second central conductors, tip end portions of the first and second rod-shaped bodies are inserted into the joining portion of the tubular body, and the first and second rod-shaped bodies have a total length such that a state in which distal end surfaces of both the rod-shaped bodies face each other a gap is maintained.

14. An inspection jig comprising:
the contact terminal according to claim 13; and
a support member that supports the contact terminal.

15. An inspection device comprising:
the inspection jig according to claim 14; and
an inspection processing unit that inspects an inspection target based on an electric signal obtained by bringing the contact terminal into contact with an inspection point formed at the inspection target.

16. A contact terminal comprising:
a tubular body made of an electrically conductive material;
a central conductor that is rod-shaped and made of an electrically conductive material, the central conductor comprising a first rod-shaped body in the tubular body;
wherein
the first rod-shaped body comprises a proximal end portion; and
the tubular body comprises:
a first spring portion having a helical body defined by a first helical groove formed in the tubular body, and
a first clasping portion configured to clasp the proximal end portion of the first rod-shaped body, the first clasping portion formed as at least a partial circumferential ring of the tubular body.

17. The contact terminal according to claim 16, wherein
the first clasping portion and the proximal end portion of the first rod-shaped body are clasped together by a press fit.

18. The contact terminal according to claim 16, wherein
the tubular body further comprises:
a second spring portion having a helical body defined by a second helical groove formed in the tubular body.

19. The contact terminal according to claim 18, wherein
the first rod-shaped body is in a first end of the tubular body;
the central conductor further comprises a second rod-shaped body in a second end of the tubular body;
the second rod-shaped body comprises a proximal end portion;
the tubular body further comprises:
a second clasping portion configured to clasp the proximal end portion of the second rod-shaped body, the second clasping portion formed as at least a partial circumferential ring of the tubular body.

20. The contact terminal according to claim 18, wherein the first clasping portion comprises a first slit and the second clasping portion comprises a second slit;

the first clasping portion and the first spring portion are contiguous and the first helical groove in the tubular body is continuous with the first slit; and the second clasping portion and the second spring portion are contiguous and the second helical groove in the tubular body is continuous with the second slit.

* * * * *